(12) United States Patent
Cummings et al.

(10) Patent No.: US 7,866,035 B2
(45) Date of Patent: Jan. 11, 2011

(54) WATER-COOLED PHOTOVOLTAIC RECEIVER AND ASSEMBLY METHOD

(75) Inventors: Eric Bryant Cummings, Livermore, CA (US); Kevin Christopher Moore, Sierra Madre, CA (US)

(73) Assignee: CoolEarth Solar, Livermore, CA (US)

( * ) Notice: Subject to any disclaimer, the term of this patent is extended or adjusted under 35 U.S.C. 154(b) by 465 days.

(21) Appl. No.: 11/844,888

(22) Filed: Aug. 24, 2007

(65) Prior Publication Data

US 2008/0135095 A1  Jun. 12, 2008

Related U.S. Application Data

(60) Provisional application No. 60/840,156, filed on Aug. 25, 2006.

(51) Int. Cl.
*H05K 3/20* (2006.01)

(52) U.S. Cl. .............................. 29/831; 29/832; 29/854; 29/852; 29/743; 29/760; 257/E27.125; 257/E27.007; 323/906; 204/196.27

(58) Field of Classification Search .................. 29/832, 29/854, 852, 743, 760, 890.033; 257/E27.125, 257/E25.007; 323/906; 204/196.27
See application file for complete search history.

(56) References Cited

U.S. PATENT DOCUMENTS

| | | | |
|---|---|---|---|
| 2,952,189 A | 9/1960 | Pajes | |
| 3,054,328 A | 9/1962 | Rodgers | |
| 3,056,131 A | 9/1962 | McCreary | |
| 3,125,758 A | 3/1964 | Koehler | |
| 3,326,624 A | 6/1967 | Von Maydell et al. | |
| 4,063,676 A | 12/1977 | Lilly | |
| 4,086,908 A | 5/1978 | Werner et al. | |
| 4,201,195 A | 5/1980 | Sakhuja | |
| 4,361,717 A | 11/1982 | Gilmore et al. | |
| 4,543,945 A | 10/1985 | Hattan | |
| 4,563,383 A | 1/1986 | Kuneman et al. | |
| 4,672,389 A | 6/1987 | Ulry | |
| 4,846,896 A | 7/1989 | Hokuyo | |
| 5,211,200 A | 5/1993 | Cassidy | |
| 5,305,793 A | 4/1994 | Cencula | |
| 5,316,075 A | 5/1994 | Quon et al. | |
| 5,403,651 A | 4/1995 | Miyagi | |
| 5,893,360 A | 4/1999 | Stoumen | |
| 6,029,742 A | 2/2000 | Burward-Hoy | |
| 6,395,972 B1 * | 5/2002 | Tran et al. .................. 136/251 |
| 6,803,514 B2 | 10/2004 | Takeyama | |
| 6,806,415 B2 | 10/2004 | Fujisaki et al. | |
| 6,897,832 B2 | 5/2005 | Essig, Jr. et al. | |

(Continued)

OTHER PUBLICATIONS

Martin, H., "Heat and Mass Transfer between Impinging Gas Jets and Solid Surfaces," *Advances in Heat Transfer*, 13:1-60 (1977).

*Primary Examiner*—Derris H Banks
*Assistant Examiner*—Azm Parvez
(74) *Attorney, Agent, or Firm*—Townsend and Townsend and Crew LLP

(57) ABSTRACT

Embodiments in accordance with the present invention relate to the design and manufacturing of inexpensive photovoltaic or thermal receivers for cost-effective solar energy conversion of concentrated light. Particular embodiments in accordance with the present invention disclose the design of a photovoltaic receiver and a low-pressure, low-flow-rate liquid cooler. Embodiment of the present invention also disclose a preferred low-cost and scalable manufacturing approach.

8 Claims, 23 Drawing Sheets

U.S. PATENT DOCUMENTS

| | | | |
|---|---|---|---|
| 6,906,253 B2 * | 6/2005 | Bauman et al. | 136/256 |
| 2004/0207566 A1 | 10/2004 | Essig, Jr. et al. | |
| 2007/0226995 A1 * | 10/2007 | Bone | 29/832 |

* cited by examiner

Top of solar cell (black side) facing up

FIG. 10A
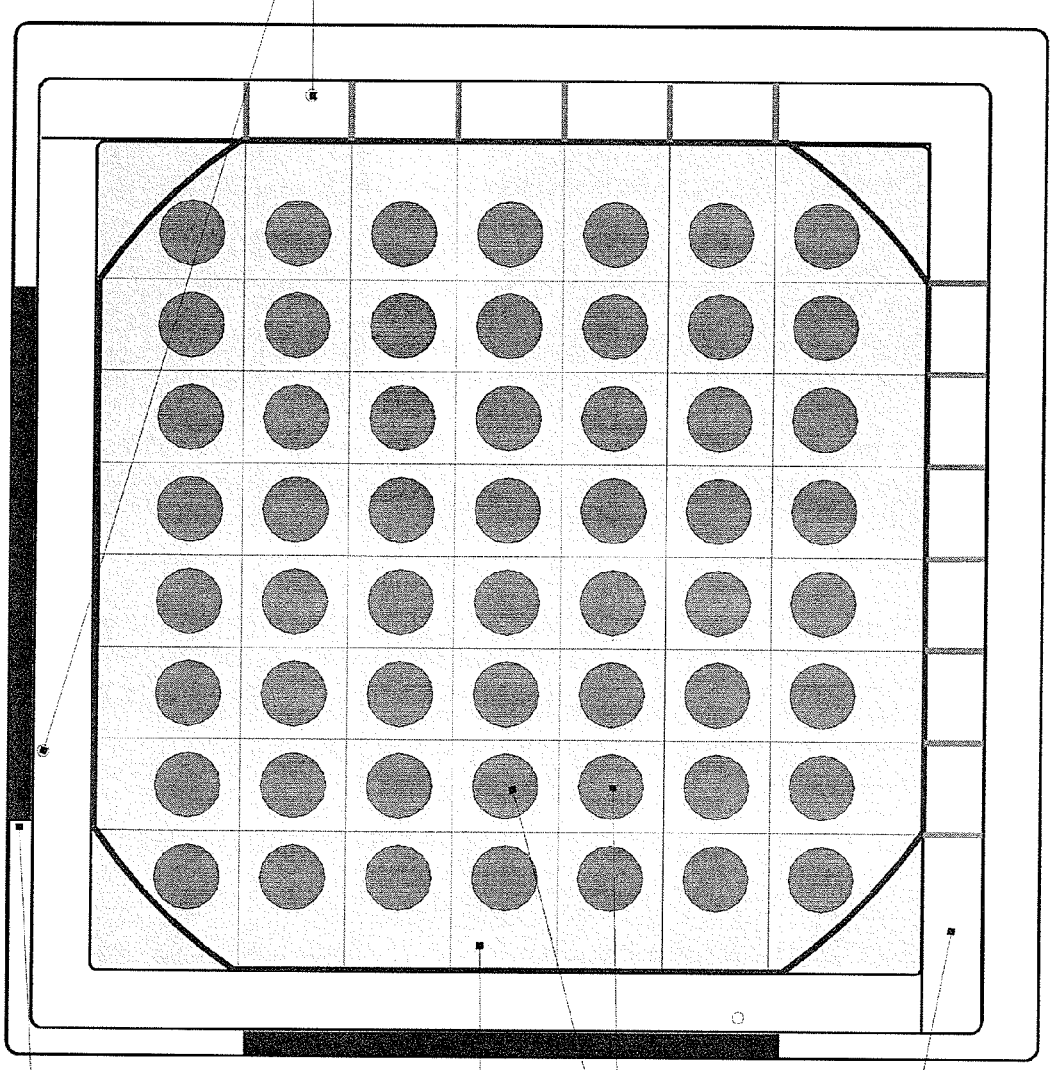
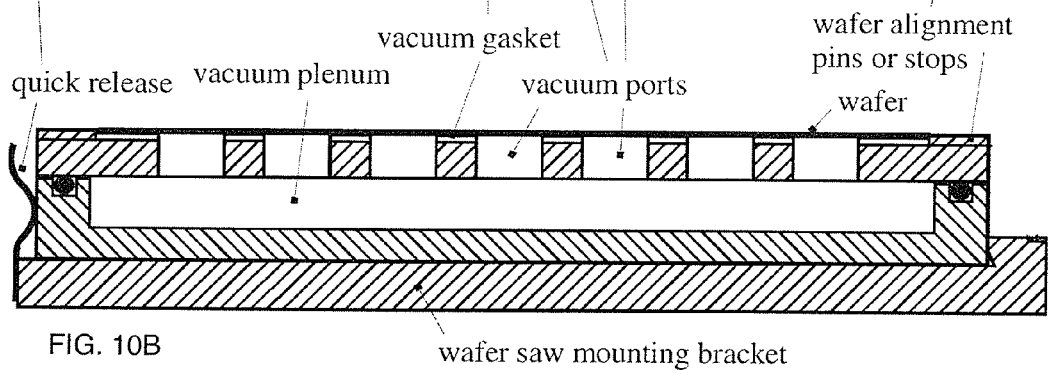
FIG. 10B 1404
1406

1402
1404

1406

1502  1504

1504

1504  1506  1508

$H$  $h$  1510

1802
1804

1806
1808

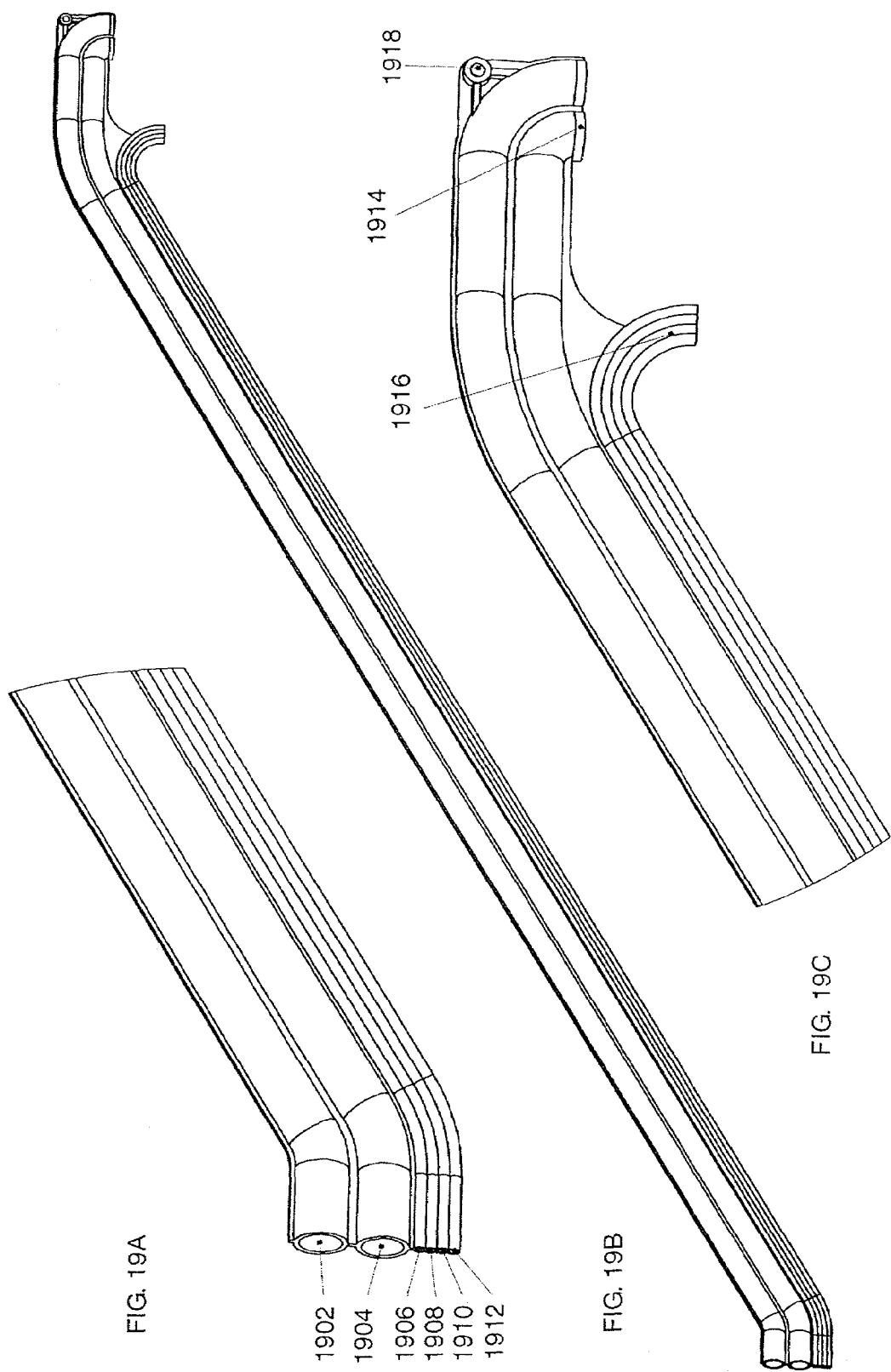

WATER-COOLED PHOTOVOLTAIC RECEIVER AND ASSEMBLY METHOD

CROSS-REFERENCES TO RELATED APPLICATIONS

The instant nonprovisional patent application claims priority to U.S. Provisional Patent Application No. 60/840,156, filed Aug. 25, 2006 and incorporated by reference in its entirety herein for all purposes. The instant nonprovisional patent application is also related to the following provisional patent applications, the disclosures of which are incorporated by reference in their entireties herein: U.S. Provisional Patent Application No. 60/839,841 filed Aug. 23, 2006; U.S. Provisional Patent Application No. 60/839,855 filed Aug. 23, 2006; and U.S. Provisional Patent Application No. 60/840,110 filed Aug. 25, 2006.

BACKGROUND OF THE INVENTION

Solar radiation is the most abundant energy source on earth. However, attempts to harness solar power at large scales have so far failed to be economically competitive with most fossil-fuel energy sources. One possible reason for this failure is that the solar flux is not intense enough for direct conversion at one solar flux to be cost effective.

Solar concentrator technology seeks to address this issue. Solar radiation is one of the most easy energy forms to manipulate and concentrate. It can be refracted, diffracted, or reflected to many thousands of times the initial flux, using only modest materials.

With so many possible approaches, a multitude of solar concentrator approaches have been proposed. So far, however, such conventional solar concentrator systems cost too much to compete unsubsidized with all fossil fuels.

One reason for this are costs related to the solar energy receiver. While the energy-conversion material of a receiver may be expensive, particularly in the case of multiple-junction and other high-efficiency photovoltaic cells, the mounting, service connections, and module assembly costs may contribute significantly to the overall receiver system cost.

Moreover, receivers for solar concentrators typically require cooling for efficient operation. Inefficient cooling can place an inordinate parasitic load on the system and ineffective cooling can reduce energy conversion efficiency, reducing output and revenue. In addition, the structure to mount and service solar receivers is conventionally material intensive.

Accordingly, there is a need in the art for improved designs, assembly techniques, and cooling modalities for receiver assemblies for solar concentrators, which exhibit greater simplicity and less intensive consumption of materials, lower cost, better scalability, and better operating efficiency and effectiveness.

BRIEF SUMMARY OF THE INVENTION

Embodiments in accordance with the present invention relate to the design and manufacturing of inexpensive photovoltaic or thermal receivers for cost-effective solar energy conversion of concentrated light. Particular embodiments in accordance with the present invention disclose the design of a photovoltaic receiver and a low-pressure, low-flow-rate liquid cooler and apparatus to support the receiver. Embodiments of the present invention also disclose a preferred low-cost and scalable manufacturing approach.

An embodiment of a photovoltaic receiver in accordance with the present invention comprises a printed circuit board (PCB) having formed therethrough a plurality of electrically conducting vias, and a diode within a substrate, an electrically conducting trace on a backside of the substrate in electrical communication with the diode and with an electrically conducting trace on a surface of the printed circuit board, the trace providing parallel paths for current and heat from the diode structure, a further conductor present in a side of the PC board opposite the surface spread to conduct current, and spread to conduct heat to an electrical insulator.

An embodiment of a method in accordance with the present invention for assembling a photovoltaic receiver, comprises, dicing a solar cell into pieces having a diode, forming a PC board having a plurality of electrically conducting vias therethrough, disposing backsides of the pieces onto the PC board aligned to the underlying vias.

An embodiment of a method in accordance with the present invention for constraining thermal expansion of a printed circuit (PC) board with respect to an overlying diode structure, comprises, constraining edges of the PC board and drawing a partial vacuum in at least one region on a non-soldered side of the PC board.

An embodiment of a method in accordance with the present invention of contacting a plurality of diode structures to a supporting printed circuit board, the method comprising simultaneously applying a partial vacuum to at least one region behind the diode structures.

An embodiment of a clamshell fixture in accordance with the present invention comprises a first portion comprising a first vacuum chuck configured to hold a diode structure, and a second portion hinged to the first portion, the second portion comprising a second vacuum chuck configured to hold a printed circuit board, wherein bringing the first and second portions together to close the clamshell aligns the diode structure relative to the PC board prior to a soldering process.

An embodiment of a method in accordance with the present invention of assembling a photovoltaic receiver, comprises, disposing a front side of a substrate having a plurality of photovoltaic regions on a common support, physically separating the plurality of photovoltaic regions into die supported by the common support, and contacting back sides of the separated die with patterned conductors bonded to an insulating substrate.

An embodiment of a photovoltaic receiver in accordance with the present invention comprises a divider separating an inlet plenum and an outlet plenum, the receiver cooled by at least one inertial coolant jet flowing through an orifice in the divider.

An embodiment of an apparatus in accordance with the present invention comprises a first support structure in contact with a solar energy concentrator, a receiver configured to receive solar energy from the concentrator, the receiver in contact with a rigid strut extending from a first portion of the first support structure, a first cable having a first end proximate to the first support structure and extending across the solar concentrator to a second support structure in contact with the solar energy concentrator, and a second cable extending from either the second support structure or a portion of the first cable proximate to the second support structure, to either the receiver or a portion of the rigid strut proximate to the receiver, the second cable configured to stabilize a position of the receiver.

These and other embodiments of the present invention, as well as its features and some potential advantages are described in more detail in conjunction with the text below and attached figures.

BRIEF DESCRIPTION OF THE DRAWINGS

FIGS. 10A-B show plan and cross-sectional views of a wafer dicing and printed circuit board alignment jig in accordance with an embodiment of the present invention.

FIGS. 19A-C show views of a rigid strut having provision for a more complicated arrangement of cables, top mounting to the receiver, and provision for mounting a tensile support cable.

DETAILED DESCRIPTION OF THE INVENTION

Embodiments in accordance with the present invention relate to the design and manufacturing of inexpensive photovoltaic or thermal receivers for cost-effective solar energy conversion of concentrated light. Particular embodiments in accordance with the present invention disclose the design of a photovoltaic or thermal receiver and a low-pressure, low-flow-rate liquid cooler and receiver support hardware. Embodiments of the present invention also disclose a preferred low-cost and scalable manufacturing approach.

One objective in accordance with the present invention is to provide a cost-effective and manufacturable receiver system for solar concentrators. Such systems typically have several basic functions:

mechanically supporting a photovoltaic cell or array of photovoltaic cells;

cooling the receiver or capturing heat energy into a working fluid; and providing efficient electrical interconnections to prevent excessive resistive losses.

Figure 1:
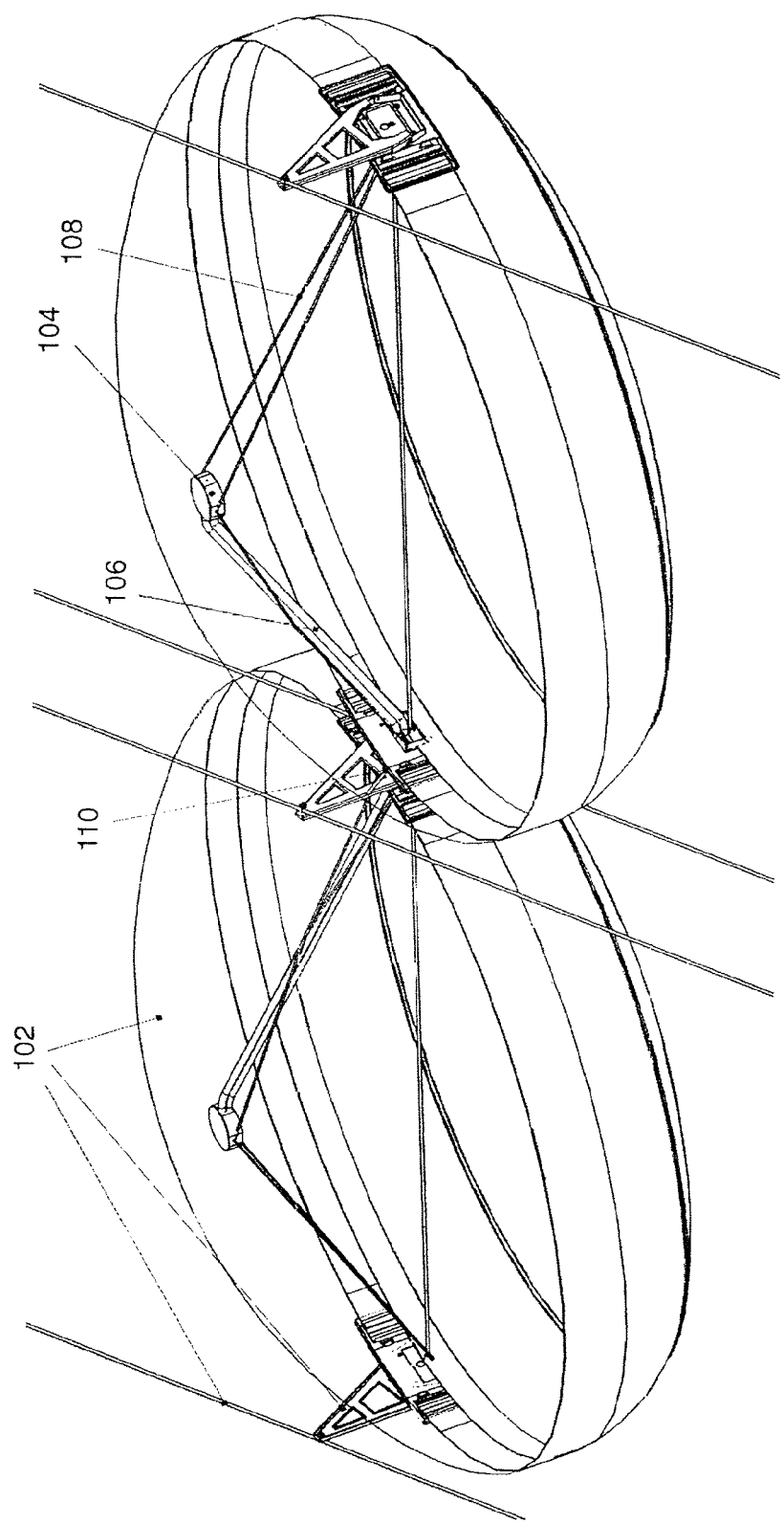
FIG. 1 shows a design of an embodiment of the complete receiver system used in the context of an inflated solar concentrator.

FIG. 1 shows an embodiment of a receiver assembly according to the present invention, in the context of an inflated solar concentrator and solar tracker apparatus 102. A solar receiver 104 is supported to intercept a maximal amount of collected light.

This receiver is held in place by at least one rigid strut 106. This strut may further carry coolant, electricity, reactants, products, gases, and signals to support the function of the receiver or other elements of the system.

This receiver is also held in place by one or more tensile elements such as cables or bands. The tensile force of these elements stabilizes the position of the receiver 104.

As used herein, the term "cable" may comprise at least one wire, extrusion, wire rope, natural or synthetic rope, weaves, fiber-reinforced composites, fiber-reinforced ropes, cable assemblies, and the like. In a particular embodiment, a flexible metal tape or strip that is able to buckle under compression without damage may be used. As used herein, the term "cable" may also refer to any structural member that is not required to support substantial bending loads or axial compression in normal operation, regardless of whether the actual member itself is able to support bending or compression. Thus, embodiments of the present invention provide for the use of one or more conventional compressive truss elements (such as angle extrusions, I-extrusions, C-extrusions, rods, tubes, or rectangular bars) in place of wire ropes or the like.

In some embodiments the force or length of the cable may further be adjusted to adjust the position of the receiver with respect to the concentrator. Rigid elements, such as a strut 106 may provide the necessary reaction force to resist such tension.

In the embodiment shown in FIG. 1, the reaction force is transferred by element 106 to a strut coupler that is hidden in FIG. 1 by other apparatus. In the symmetrical arrangement shown, moments produced by this reaction force may be substantially balanced, such that little bending or twisting moments are experienced outside of the receiver assembly. The symmetrical arrangement of concentrators and receivers also has advantages in minimizing interconnections and facilitating sharing apparatus between receiver assemblies.

Figure 2:
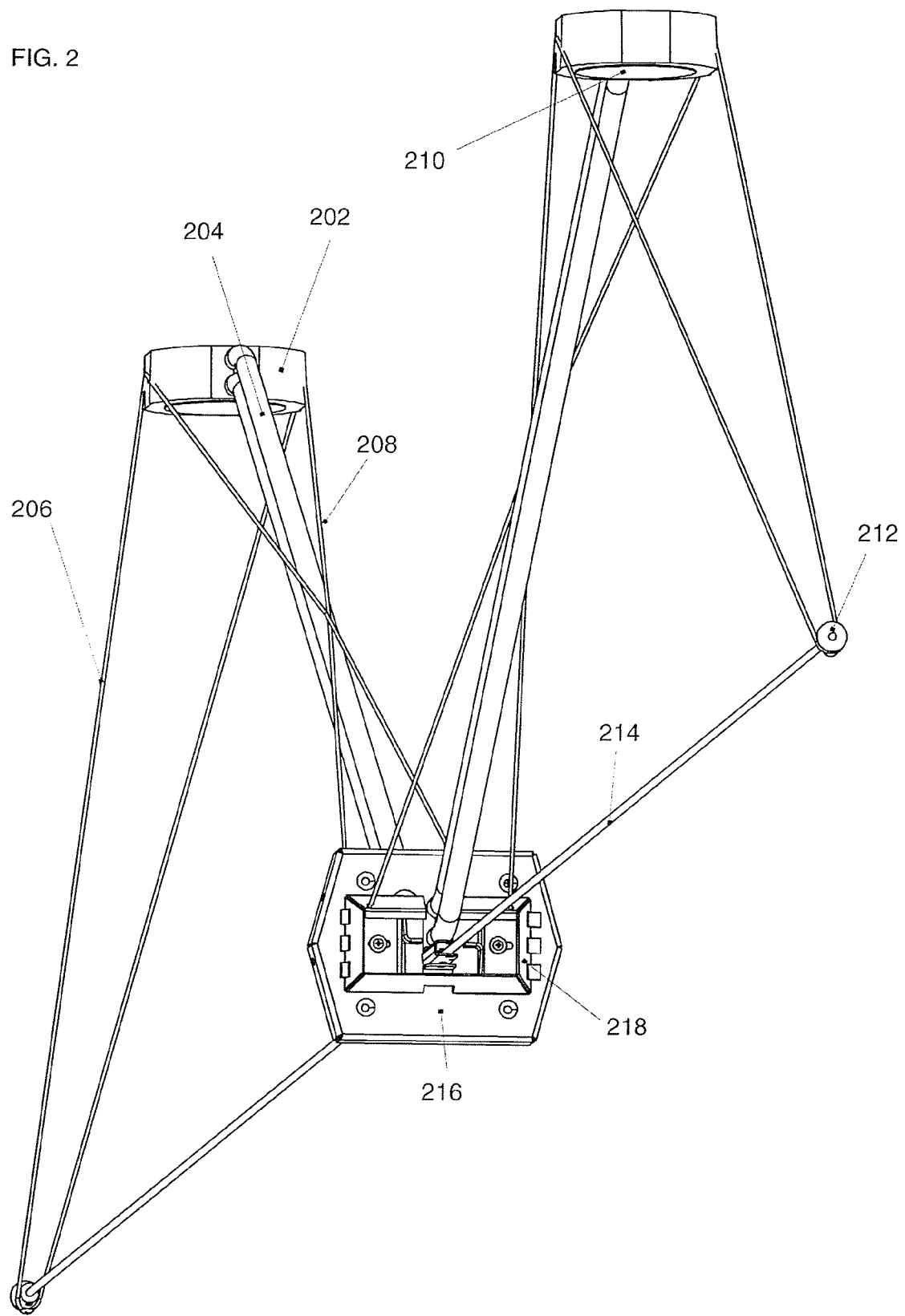
FIG. 2 shows a view of details of a receiver system according to an embodiment of the present invention.

FIG. 2 shows a view of the receiver assembly from FIG. 1. Element 202 is the receiver body. Element 204 is a rigid strut that further provides conduits for electricity, signals, and coolant. Element 206 is a tensile member such as a cable that is used to stabilize the position of the receiver. Element 208 is an additional tensile member such as a cable, that is used in concert with 204 and 206, to stabilize the receiver position.

Element 210 is the active area of the receiver. This element may generally comprise a photovoltaic element, absorber, photolytic cell, one or more optical elements, etc. Element 212 is a support structure for the concentrator.

Element 214 is an optional tensile member such as a cable, that runs substantially across a diameter of the concentrator. This cable provides additional dimensional control over the concentrator and actuates a latch mechanism 218 such that when cable 214 moves by an appreciable amount along its axis, a latch 218 can release the concentrator from its mount for servicing. The function of these elements is ancillary to the receiver assembly, however, some of these elements e.g., support structure 216, are rigidly connected to elements of the receiver assembly, e.g., the strut coupler, which is obscured in this view by support structure 216. While support structure 216 is shown as a single structure, in actuality it can comprise an assembly of a number of different components, including a cover and a housing While support structure 216 is shown as a single structure, in actuality it can comprise an assembly of a number of different components, including a cover and a housing, parts that fasten together to form a pivot, tubes, valves, printed circuitry, latches to hold concentrators in place, alignment pins and features to orient the concentrators with respect to the receiver assembly, etc.

While the particular embodiment of FIG. 2 shows tensile member 206 as connected between the support structure 212 and the receiver 202, this is not required by the present invention. In accordance with alternative embodiments, the ends of tensile member 206 could instead be connected to the between the rigid strut 204 proximate to the receiver, or to tensile member 214 proximate to the support structure 212.

Figure 3:
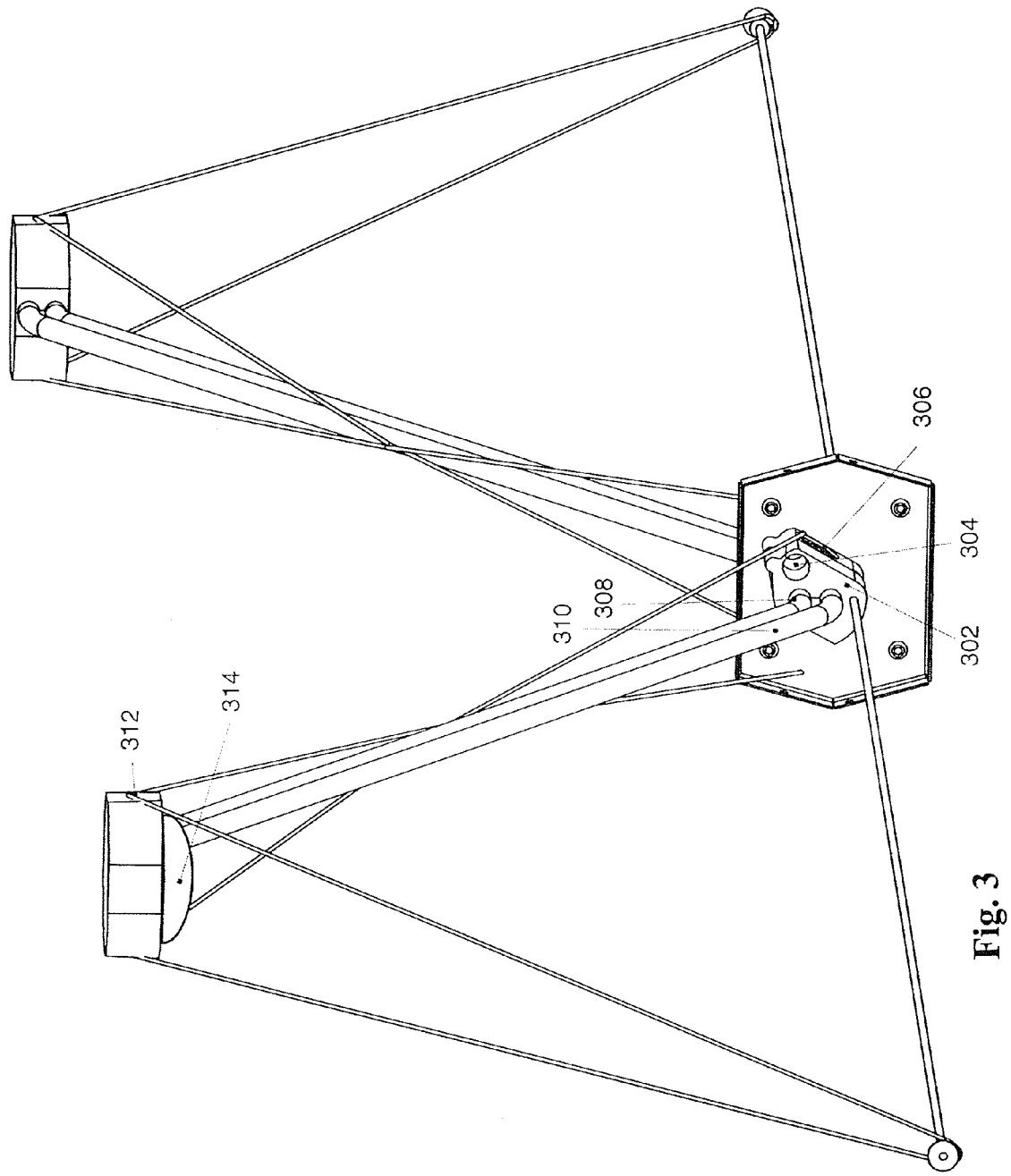
FIG. 3 shows a reverse-angle view of the receiver system in FIG. 2, with some parts removed to expose a strut-coupling mechanism according to an embodiment of the present invention.

FIG. 3 shows a reverse-angle view of the receiver assembly in FIG. 2, with some parts removed to reveal the strut-coupler assembly 302. In the embodiment in FIGS. 1-3, the strut-coupler assembly performs a number of active functions in additional to mechanically coupling the rigid struts. Element 304 is an inflation air port that passes inside an inflatable concentrator shown in FIG. 1. Element 306 is the location of a valve seat that supports the regulation of inflation pressure of one or two concentrators. Coolant flows toward the receiver through a conduit in the strut 308 and heated coolant exhausts from the receiver through conduit 310.

The receiver module or strut may provide for connection of one or more tensile cables to stabilize and, in some embodiments, adjust receiver position. In this embodiment, cables connect directly to the main receiver housing at 312.

An element that is intermediary between collected light and the actual light-energy-conversion element is schematically indicated at 314. This element may be reflective, diffractive, and refractive in various stages to perform its function. It may simply serve to reinforce light-energy conversion elements. It may further concentrate or diffuse light. It may render illumination on the conversion material more uniform, less angle dependent, spectrally and spatially controlled, etc. The element may protect the conversion material from mechanical damage, e.g., during transport, installation, and wind storms and environmental factors, such as water, humidity, condensation, oxygen, ozone, pollution, dust, airborne particles, etc.

In some embodiments this element swings out, inflates or otherwise deploys inside a concentrator. In some embodiments, this deployment is controlled by applying tension to one or more elements. In other embodiments, this deployment is controlled by compression. In some embodiments deployment is controlled by elements that remain in the concentrator, while in other embodiments, deployment is controlled by tools that are removed from the concentrator. In some embodiments, mechanical features, such as detents and other mechanical clips maintain the deployed position. Other embodiments employ alternative features such as magnets, mechanical fasteners, etc. to maintain the deployed position. Still other embodiments employ liquid or gas pressure to deploy or to maintain the deployed position or both.

In some embodiments the deployed position is regulated by an active or passive approach. In some embodiments, the position of the element slews in the manner of an active or passive optical image stabilizer. In some embodiments, slew is controlled at least in part means of one or more of elasticity (e.g., springs), damping (e.g., dashpots), and inertia (e.g., masses). In other embodiments slew is controlled at least in part by motors, solenoids, etc. In some embodiments, slew is controlled via phenomena that occur as a result of a misalignment, e.g., via heating, direct or indirect responses to solar irradiation and gradients therein, etc.

Figure 4A:
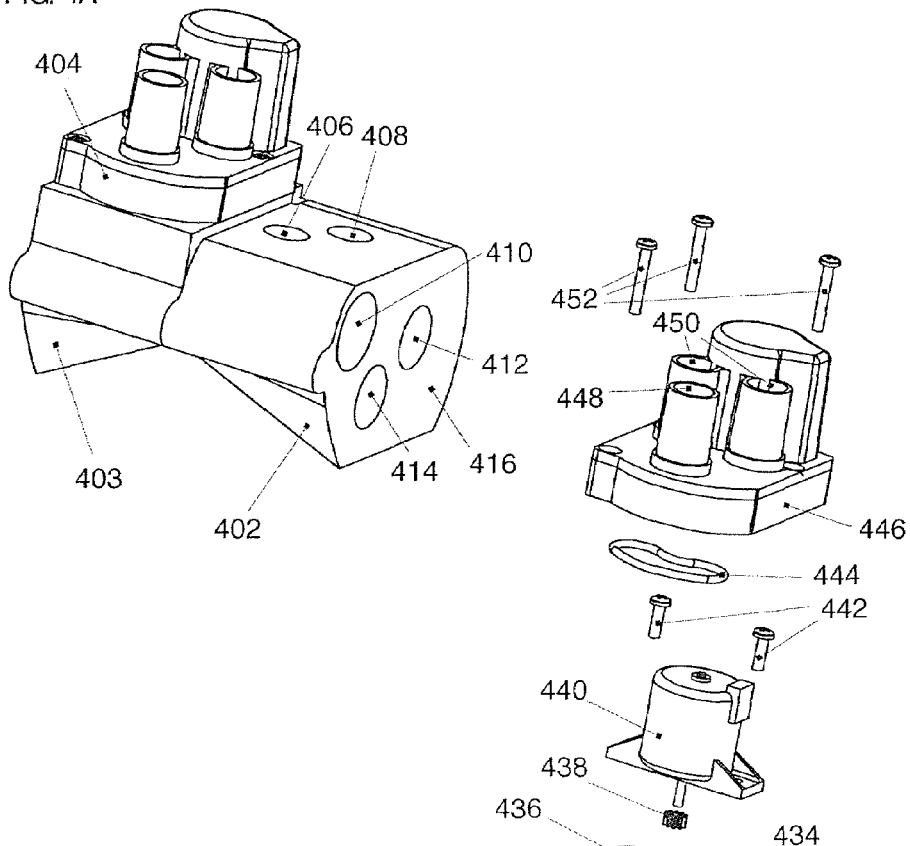
FIG. 4A shows an assembled view of the strut-coupling mechanism shown in FIG. 3.
Figure 4B:
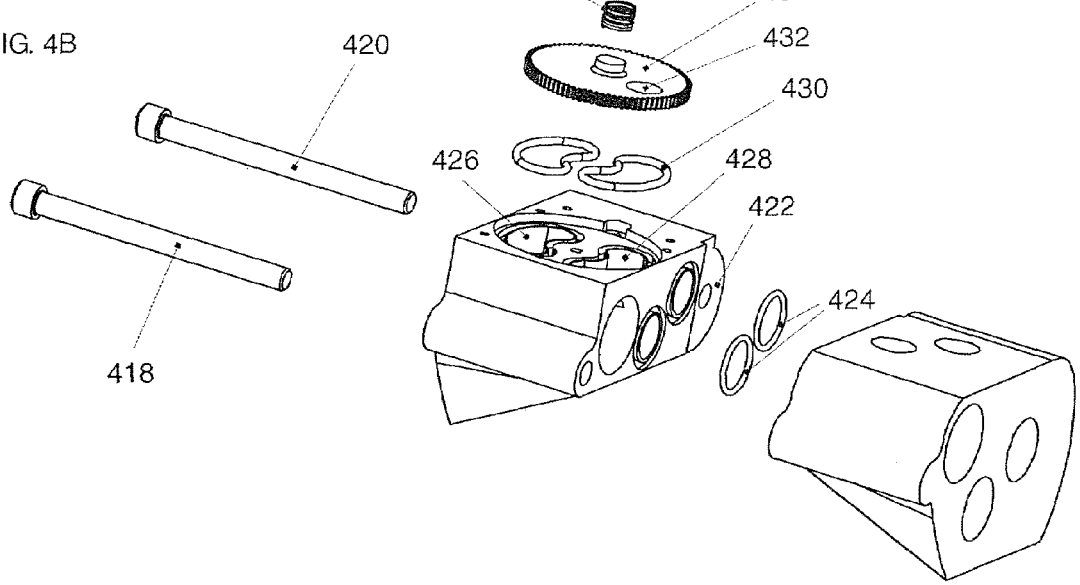
FIG. 4B shows an exploded view of the strut-coupling mechanism shown in FIG. 3.

FIG. 4 shows an assembled and exploded view of a strut coupler (element 302). This coupler performs a number of functions in addition to providing mechanical support for rigid struts. In the embodiment shown in FIG. 4, the coupler comprises two main components 402 and 403 that service struts on opposing sides of the tandem mounted concentrators shown in FIG. 1.

Element 404 is an inflation fluid valve that can service both concentrators independently. In other embodiments, separate valves could be used to service concentrators.

Ports 406 and 408 connect respectively to the cool and hot side of coolant interconnections. These ports service both concentrators. Port 414 feeds cool coolant to the strut while 412 exhausts relatively hot coolant from the strut.

Port 410 provides fully regulated inflation fluid to one concentrator, bypassing the strut in this embodiment. In other embodiments, inflation fluid may flow through the strut. In other embodiments, one or more of inflation fluid and exhaust fluid may flow through the strut.

In some embodiments, regulation is performed in the receiver housing. In other embodiments, regulation is performed in a part of the system that is removed when concentrators are serviced. This alternate arrangement may be preferable if valve components require relatively frequent maintenance.

In some embodiments, the output of a regulator passes to more than one concentrator. In other embodiments, valves do not fully regulate the pressure, i.e., a valve may only open to provide inflation fluid. In other embodiments, a valve may only open to exhaust inflation fluid.

Some embodiments may employ metering valves. Some embodiments may employ on-off valves. Some embodiments may employ passive regulators. Other embodiments may employ a hybrid of an actively adjustable passive regulator.

Element 418 is a structural bolt. Element 420 is both a structural bolt and a bearing surface. In this embodiment, 420 is a pivot for solar tracker hardware that also bears on the face 422 directly or though a washer.

Elements 424 are O-rings that seal the coolant connections between 402 and 403. Alternatively, gasket seals, adhesive bonds, tight mechanical tolerances, or pressure could be used to prevent excessive coolant leakage.

The port 426 is in direct fluid communication with one concentrator and port 428 is in direct fluid communication with another concentrator through port 410. In this embodiment, a mechanical preload and sealant is used to minimize air leakage between 402 and 403. Other embodiments may employ an o-ring or gasket.

O-rings 430 seal pressure on the concentrator side of the valve against the face of a rotary element 434 which contains a port 432 through which fluid may pass. In this embodiment, 434 has gear teeth along its circumference to facilitate actuation. In other embodiments, 434 could be driven from its center, e.g., by a motor or solenoid having a sufficiently high torque or via a gear motor.

Element 436 optionally provides a preload. Inflation pressures may be low enough to obviate such a preload. Alternatively or in combination, grease between the surfaces of element 434, 403, and 446, alone or in combination with modest pretension, may provide an adequate seal.

Element 438 is a spur gear mounted to a motor 440. In some embodiments, this may be a helical or worm gear. In some embodiments, this motor is a brushless DC motor. In other embodiments this motor is a stepper motor. In other embodiments this motor is a brushed DC motor. In some embodiments this motor is an AC, universal, or variable reluctance motor. In yet other embodiments this motor is hydraulic or pneumatic.

In some embodiments the motor is controlled by circuitry mounted to or near the strut coupler assembly. In other embodiments the motor is controlled by circuitry mounted to or near the main receiver housing.

Some embodiments may place the motor on parts of the concentrator assembly that routinely receive maintenance. The motor may be held in place by screws 422 or other means known in the art. Alternatively, the valve cover, could restrain the motor obviating 442.

O-ring 444 seats in a groove in the valve cover 446 and seals inflation fluid from leaks. As described earlier, alternative low-pressure sealing approaches are known in the art.

The nipple 448 connect to the inflation fluid conduit. Ports 450 vent exhaust, in this case to ambient conditions. In preferred embodiments, these ports are designed to be protected from ingress of insects, dirt, and water in all concentrator positions while not excessively restricting fluid flow.

The solar receiver (104, 202) has the role of converting collected light into electricity, heat, chemical energy, etc. In addition, the receiver of this invention can perform the following additional functions:

detecting and reporting sun-tracking errors;

detecting, reporting, and possibly regulating temperature;

detecting and reporting module power performance;

regulating concentrator shape for maximum power performance; and adjusting the position and/or shape of secondary and/or tertiary optical elements.

An element of some embodiments of the present invention is a receiver strut assembly that is used in concert with one or more receivers. The strut assembly supplies mechanical support and provides conduits for one or more elements, including electricity, electronic, optical, or RF signals, digital or analog signals; fluid connections (including connections for cooling or heat-transfer liquids, e.g., molten salts or heat storage fluids), refrigerants (e.g., fluorinert and other fluorinated compounds), water, mixtures of water with one or more of anti-freeze agents, anti-corrosion agents, fungicides, algaecides, chlorine, chloramine, etc., chemical reactants, chemical products, multiple-phase fluids, and droplet bearing immiscible fluids, bubbles, low-reactivity fluids such as fluorinert, silicone oils and droplets therein, etc.; gases, e.g, air, dry air, nitrogen, inert gases, gases containing vapors to repair and maintain elements of the concentrator, chemical reactants, chemical products, etc.; and solids, e.g., chemical reactants or products, anti-corrosion agents, etc.

Some embodiments of the receiver strut in accordance with the present invention are designed with flexible features to facilitate installation and service and to resist damage from severe loads such as windstorms.

Printed Circuit Board Functions

Because a silicon solar cell typically produces ~0.5 V at its peak power efficiency current, silicon solar cells generally must be connected in series to obtain a higher output voltage. Non-silicon or multiple junction cells can produce considerably higher voltages, however, series connections may still be favorable to reduce the need to carry large electrical currents through the system.

As used herein, a printed circuit board (PCB) comprises an insulator having patterned conductors bonded to its surface. This conductor may be initially planar when bonded, and patterning is done by an etching or removal process. In other embodiments, the patterning of the conductors may be performed before bonding. In some embodiments, the patterning may include three dimensional operations such as folding, bending, embossing, or extrusion.

A large number of different approaches to connecting cells in series have been commercialized. However, the availability of high-performance whole-wafer solar cells that have backside metallization (e.g., the SunPower Corp's A-300 solar cell) creates an opportunity to produce series-connected solar modules using a novel and inexpensive process and design that provides with exceptionally good heat transfer and low series resistance for efficient conversion of concentrated solar light. Alternatively, other cells, such as triple junction or front-surface metallized cells can be mounted in a similar fashion, with additional provision for connections to and between top-side electrodes.

In accordance with an embodiment of the present invention, a wafer or part of a wafer is diced in a rectangular grid, and die are surface mounted via solder to the top side of a printed circuit board. In alternate embodiments, a wafer or part of a wafer is diced into alternate shapes either through straight-line cuts or through curved cuts as provided for by, e.g., high-speed machining, small-diameter sawing, laser cutting, bead blasting, water-jet cutting, and other techniques known in the art for cutting brittle materials.

In accordance with particular embodiments, the process of separating a wafer into individual die, and then mounting the die on a printed circuit board (PCB), occurs without tedious and time-consuming manual alignment steps. In other words, once diced, the individual die are directly mounted to the PCB en masse. This can occur, for example, by performing the dicing step as the die are supported on a common surface (such as a vacuum jig), and then in the next or closely following step, moving the PCB into contact with the supported die. In accordance with one embodiment, the PCB has conducting vias formed therein, such that the back sides of the die are aligned such that they contact electrically conducting solder paste overlying the vias.

As used herein, a printed circuit board is an electrically insulated substrate bonded to at least one conductive surface that is patterned to create electrical connections. Two preferred embodiments of printed circuit boards are conventional two- or four layer printed circuit boards having a plastic insulator, or one, two, or three-layer printed circuits having a high-thermal conductivity ceramic insulator, e.g., alumina, aluminum nitride, beryllium oxide, etc.

Heat and current flow through the solar cell to the back-side metallization of the cell, then through the solder to the top copper layer of the PCB. At the top copper layer, there is enough conduction material to prevent significant voltage or temperature drop via electrical and thermal resistance, respectively. The copper on the top side thus spreads the heat and current and provides for series electrical attachment of the die.

The copper traces on the top side may also have an array of plated via holes that conduct electricity and heat from the top side of the board to the back side copper. Alternatively, the thermal conductivity of the printed circuit board insulator can provide the function of transferring heat to the back side. The back side copper, if any, further distributes the heat over a wide area and can provide electrical connectivity. If the backside copper is electrically connected to circuits, a dielectric material on that copper surface can provide electrical isolation of the bottom copper from conductive materials including metal plates or liquid coolant for removing heat. If the backside copper is isolated from electrical circuits, it need not be electrically insulated from the liquid coolant, thereby maintaining low thermal resistance.

Electricity is provided from the printed circuit board via terminals, holes, connectors, or the like. The printed circuit board may further contain features such as holes for alignment during assembly and for mounting as well as alignment fiducial marks, silk-screened ink and other such elements well known in the field.

The printed circuit board may also contain additional circuitry. For example, a printed circuit board in accordance with an embodiment of the present invention can include one or more discrete components, e.g. diodes (especially protection diodes), transistors, resistors, capacitors, crystals, ceramic resonators, thermistors, thermocouples, and varistors.

A printed circuit board in accordance with an embodiment of the present invention can also include one or more integrated circuits, e.g. microcontrollers, microprocessors, programmable logic devices, analog-to-digital converters, operational amplifiers, comparators, digital clocks, ethernet transmitters, receivers, and transceivers, RS485 transmitters, receivers, and transceivers, radio (e.g., 802.11 or other) transmitters, receivers, and transceivers, current loop transmitters, receivers, and transceivers, differential voltage transmitters, receivers, and transceivers, optocouplers, and absolute or differential pressure-sensors.

A printed circuit board in accordance with an embodiment of the present invention can also include one or more circuits that perform specific functions, e.g., cell-voltage and current sensors, overall voltage and current sensors, temperature sensors (e.g., resistor, thermistor, diode, capacitor, thermocouple, etc.), circuitry to provide signals to regulate the temperature to actuators, circuitry and actuators to regulate the temperature, digital monitoring circuitry, analog monitoring circuitry, digital networking circuitry, circuitry to use the voltage or current from a plurality of solar-cell die to detect or measure mis-pointing or non-uniform illumination, circuitry that uses another sensor for mis-pointing, e.g. (photo-conductive sensors, photo transistors, photodiodes (PIN, conventional, etc.), or non-power-bearing solar cell die temperature sensors).

Other examples of circuitry for performing specific tasks that may be present on a circuit board in accordance with an embodiment of the present invention include, but are not limited to, circuitry to convert the DC output to another DC voltage (DC to DC converter), circuitry to convert the DC output to an AC voltage (DC inverter), circuitry to synchronize an AC output waveform, RC timing circuitry, circuitry to detect leakage current into the coolant, circuitry to detect leakage current into the housing, circuitry to detect leakage of coolant from the heat exchanger, circuitry to provide signals to other circuitry or actuators that control pointing of the concentrator or positioning of the receiver, circuitry and actuators to control the pointing of the concentrator or position of the receiver, circuitry to control the focusing properties of the receiver, especially circuitry to provide signals to actuators that adjust the inflation pressure of an inflatable concentrator, circuitry and actuators for adjusting the inflation pressure of an inflatable concentrator, circuitry to detect critical faults, circuitry and actuators to handle critical faults, circuitry to detect critical faults and report the faults electronically (e.g. when polled, when they occur, or periodically), circuitry to control the position of other optical components relative to the receiver, and circuitry to control the shape or position relative to each other of other flexible or articulated optical components.

In other embodiments of the present invention, some or all of these electronic functions and components can be performed on one or more separate printed circuit boards mounted in the receiver or in the strut assembly that services the receiver. Advantages of using multiple printed circuit boards include the ability to replace support electronics without replacing the expensive photovoltaic board, the ability to optimize assembly economics, reliability, and performance separately for the photovoltaic cell and other electronic items, and the ability to share functions between multiple receivers, e.g., employ some circuitry to service two or more receivers and thereby reduce cost, assembly, parts count, etc.

Embodiment of the Printed Circuit Board and Wafer Die Assembly

Figure 5:
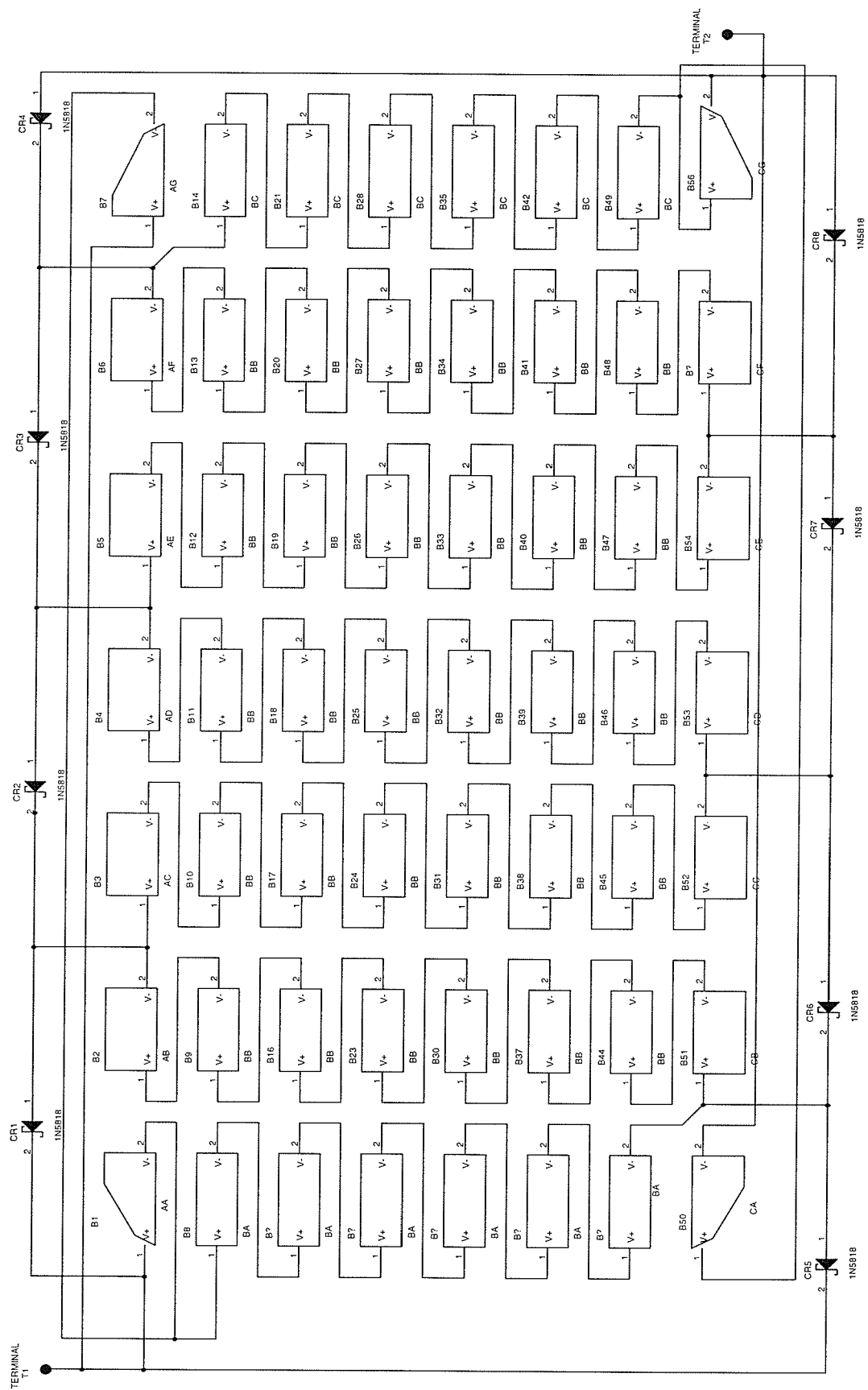
FIG. 5 shows a simplified schematic diagram of an embodiment of a solar module power circuit in accordance with an embodiment of the present invention.

FIG. 5 shows a schematic diagram of the connections of an embodiment in accordance with the present invention having only terminals and protection diodes. Each block represents a diced solar-cell piece. The arrangement of the die corresponds to the arrangement on the printed circuit board.

In the embodiment of FIG. 5, each block represents a diced portion of a back-metallized solar-cell wafer. There are 56 individual die portions, 54 of which are connected in series and two corner pieces that are shunted to balance current if the illumination is slightly peaked toward the center Alternatively, these four corner pieces can be used for detecting mis-pointing of the solar receiver either as part of the power circuitry or as separate circuits. The nominal output voltage of the module is ~24-30 V.

An alternate embodiment of the invention includes circuitry to measure the individual voltage of each piece in the array, allowing higher-order aberrations (e.g., focal and astigmatism as well as tilt) to be detected and corrected. An alternate embodiment of the invention measures the voltage across a plurality of the pieces at the edge of the array so that the total voltage generated by the interior elements of the array can be inferred from knowledge of the voltages across the elements at the edge of the array and knowledge of the total voltage of the array. Such knowledge may be used to estimate the irradiance pattern across the array; the array's characteristics may need to be known beforehand so that the effects of uneven illumination may be distinguished from variations in the conversion efficiency of the pieces in the array. Knowledge of such characteristics may not be necessary, since one way to compensate for the degradation of the array due to the poor performance of one element may be to provide it with higher irradiance compared to other elements in the array. Alternatively, the voltage of selected individual die may be measured to provide pointing error information or illumination-non-uniformity data.

Voltage or current measurements may need to be resistively divided and possibly filtered to be suitable for analog to digital conversion. In some embodiments, an analog switch allows a single analog to digital converter to be time shared between multiple signals. In some embodiments, this analog switch and converter are peripherals inside a programmable device. In some embodiments, this programmable device performs other functions, such as actuating valves and motors, communicating on the network, performing calibration corrections, and computing control-system actions. In some embodiments, the firmware in this device can be updated or adjusted in the field, preferably over a network. In some embodiments, this device contains writable eeprom data, a watch-dog timer, brown-out detection circuitry, pin protection against electrostatic discharge, etc.

In some embodiments of the present invention, some of these measurements may be used to optimize the collection characteristics of the concentrator and receiver system. As described earlier, optimization may include adjusting the amount of inflation air in a concentrator; adjusting inflation air in a secondary optical element or secondary optical element mount; otherwise adjusting the position or shape of a secondary optical element; adjusting tension in or the length of cables supporting the receiver, etc.

In some embodiments of the present invention, some of these measurements may be used in concert with those of other collectors to optimize the collection characteristics of an entire row of concentrators, e.g., adjust the orientation angles of the array, adjust cables that correct higher-order pointing errors of concentrators (not common between concentrators) in the array. The measurement data from a concentrator may be reported over a network to a control system computer, microprocessor, microcontroller, programmable logic device, application-specific integrated circuit, and the like.

In some embodiments, the amount of air in a balloon or inflation pressure is dithered or otherwise adjusted to locate the most-efficient setting. In some embodiments, this adjustment is done in one or more valves in the receiver system. In other embodiments, other adjustments are made in this optimization. Other factors including wind-induced vibrations and distortions, clouds, and the like, also affect control-system measurements, complicating such a control scheme. It may be desirable to isolate the effect of any control-system adjustment from these other factors. One approach is to employ data from other concentrators in the same array or concentrators in other arrays to provide normalization data for this optimization. For example, a passing cloud would affect the output of all concentrators. By normalizing the output of a concentrator undergoing a control-system operation such as a dither by the output of collectors that are not making simultaneous adjustments or the combined output of a large number of collectors that are making incoherent adjustments, the effect of clouds on the dithered signal may be suppressed. As such, in some embodiments, control system adjustments are staggered in time between individual concentrators or groups of concentrators.

In addition, nearby concentrators will be affected by structural vibrations in somewhat similar ways, allowing some ability to account for these effects. Moreover, vibrations generally have specific discrete frequencies that can be effectively filtered. Vibration frequencies of relevant structures are generally of order 1 Hz. By keeping the frequencies of dithering or other control-system actions well outside this frequency band, the effect of vibrations on the optimization may be reduced. Alternatively or in combination, dithering or other control-system functions may be performed in a pseudo-random spread-spectrum code that can suppress noise from environmental factors.

Other apparatus, such as the tracking system of an array may benefit from data provided by the receiver assembly. For example, separate die voltage measurements, if available, may provide angular error information which could be used individually or in the aggregate for arrayed concentrators to null pointing errors. Alternatively, the total power output, total voltage, or total current through receivers or the sum of voltages or power from receivers may be used as feedback in a dithering control system. Such a control system may use data from other arrays to normalize feedback signals or measurements to suppress environmental noise or interference. Other possible feedback measurements include heat flux, temperature, thermal noise, junction band gap, additional monitoring devices, e.g., non-power producing solar-cell die, photodetectors, photodiodes, phototransistors, pyroelectric devices, thermocouples, varistors, thermistor, diodes, CCD sensors, CMOS sensors, cameras, video cameras, and the like.

Data and actuators, throttles, meters, or switches from the receiver system may also be used to optimize coolant flow to individual concentrators, pairs of concentrators, or arrays of concentrators; the gas pressure in a common inflation gas bus; power output by switching between parallel, bypass, or series connections; the tension in rigging cables; the damping characteristics of dampers, especially tuned dampers.

Figure 6:
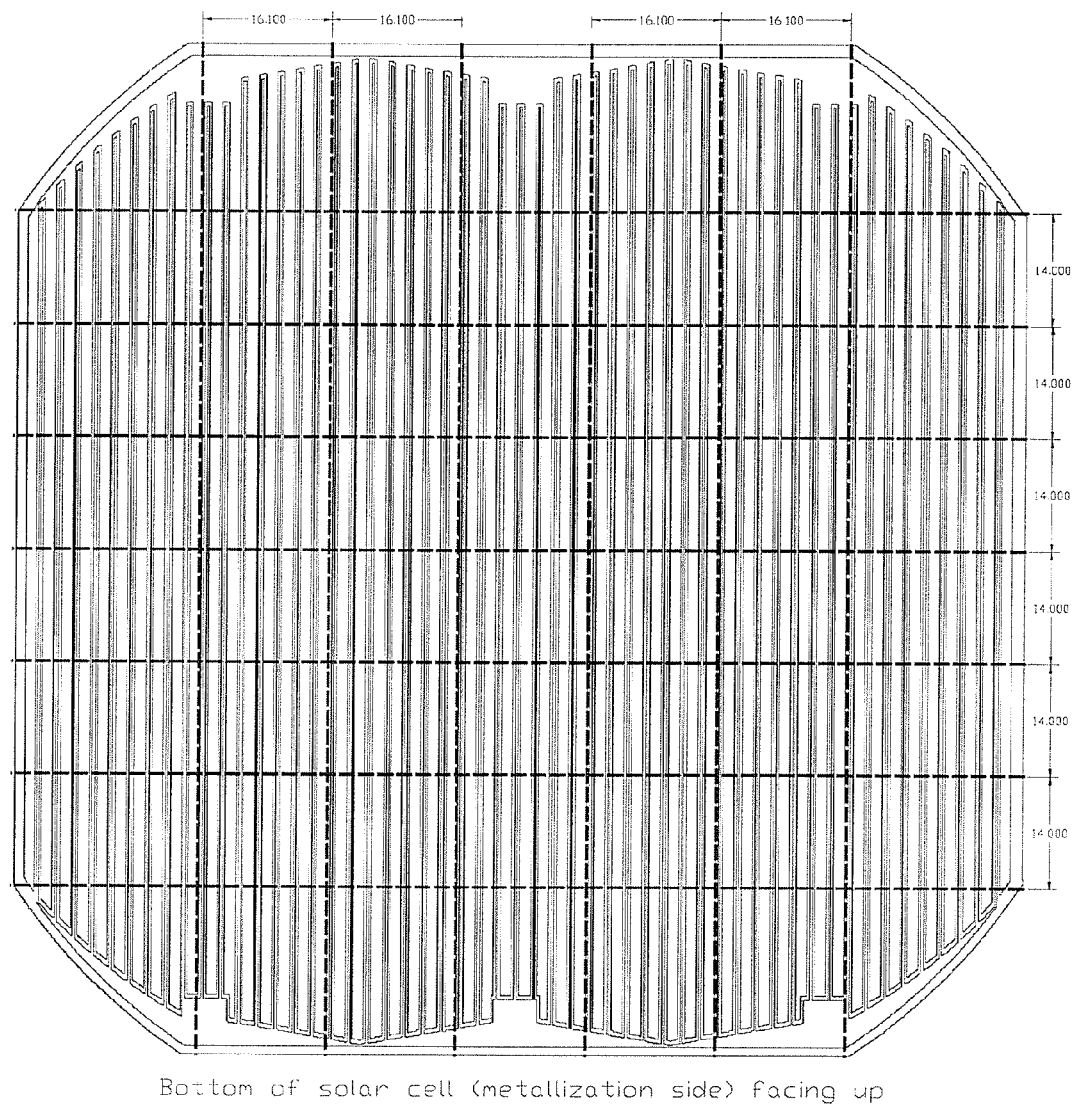
FIG. 6 shows a simplified schematic diagram of an embodiment of a solar-cell dicing pattern.

FIG. 6 shows a picture of the solar cell with the dicing-saw marks indicated in the thick dashed lines. Dimensions are in millimeters. Because of the discreteness of the metallization pattern, the die size typically cannot be adjusted arbitrarily without incurring efficiency losses. The roughly square shape of the die was chosen to minimize the number of saw cuts to obtain the target voltage. The outermost rows and columns of the die are enlarged from the central die to accommodate for illumination that is peaked toward the center of the cell and to minimize the performance degradation from modest mispointing of the concentrator.

Several alternative approaches exit to treat non-uniform illumination profiles. For example, cells can be diced in more general patterns, such that the light flux falling on each cell is substantially equal. Alternatively, multiple diced cells can be connected in parallel such that the combined flux on groups of die is substantially equal. Further alternatively, optical techniques can be used to redistribute light, e.g., secondary and tertiary optical elements, imaging and non-imaging optics, prismatic and kaleidoscopic elements, etc., and any combination of techniques.

In accordance with certain embodiments, the die geometries are circles. Other embodiments utilize the regions between concentric circles, or radially cut axisymmetric shapes.

Figure 7A:
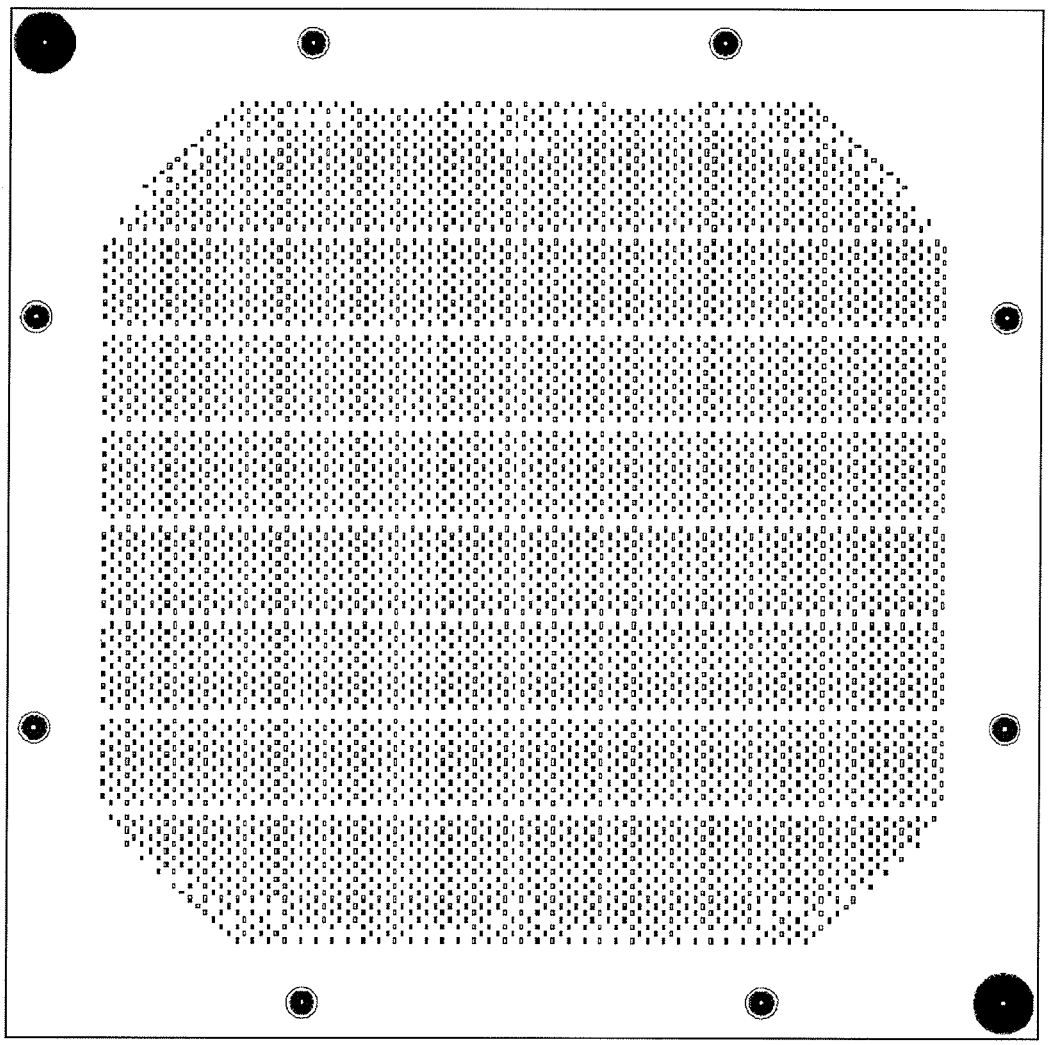
FIG. 7A shows a detailed view of solder paste and mask regions of printed circuit board layers in accordance with an embodiment of the present invention.

FIGS. 7A-D shows an example of the design of a printed circuit board according to an embodiment of the present invention. FIG. 7A shows the holes in the solder mask. In other embodiments, these holes can be highly elongated stripes, etc. to provide for the best electrical, mechanical, and thermal mate with die.

The solder-paste stencil design roughly corresponds to the solder mask design, but can be adjusted independently to optimize the final solder shape and to improve the stencil process and stencil lifetime, e.g., by rounding the corners to help with stenciling or overfilling or underfilling the solder mask holes as needed to compensate for wicking of the solder on the metallized cell. It is also possible to control solder flow by adding an appropriate solder mask layer to the back of the solar cell, however this practice adds cost and processing steps to the assembly that may not be justified.

Figure 7B:
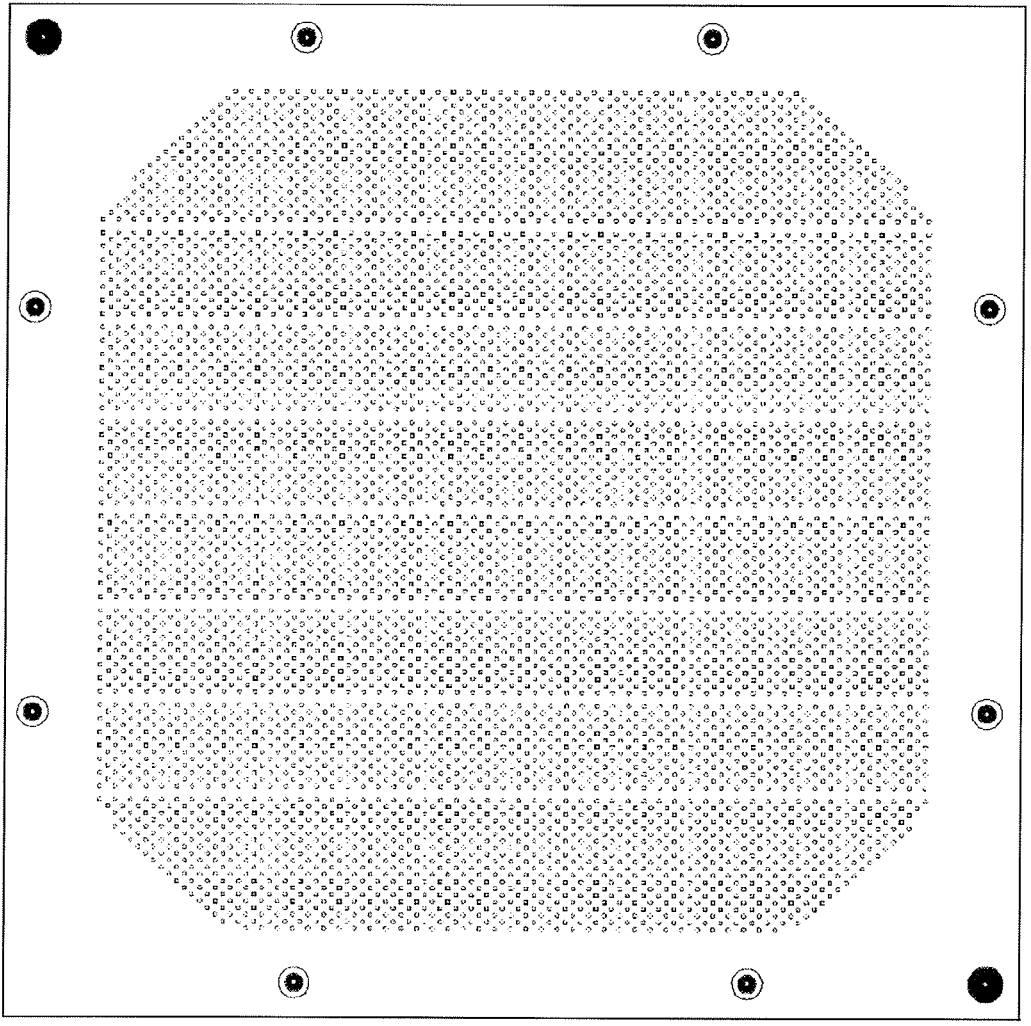
FIG. 7B shows a detailed view of a hole pattern of a printed circuit board in accordance with an embodiment of the present invention.

FIG. 7B shows the drill holes in the printed circuit board. Each hole is plated with copper to be an efficient heat and electrical current conduit through the printed circuit board. The large number of holes is intended to lower the thermal resistance from the front to the back and to reduce the variation in surface temperature of the solar cell. Other embodiments obviate this array of holes by providing for adequate heat flux through the dielectric material of the printed circuit.

Ideally, each hole is plated closed. Alternatively, the hole could be filled with solder or a sealant material. If the holes are filled or designed so as not to wick excessive solder from the pad, the rectangular solder mask holes shown could be connected together as longer strips, providing a more solid electrical and thermal connection to the solar cell.

Figure 7C:
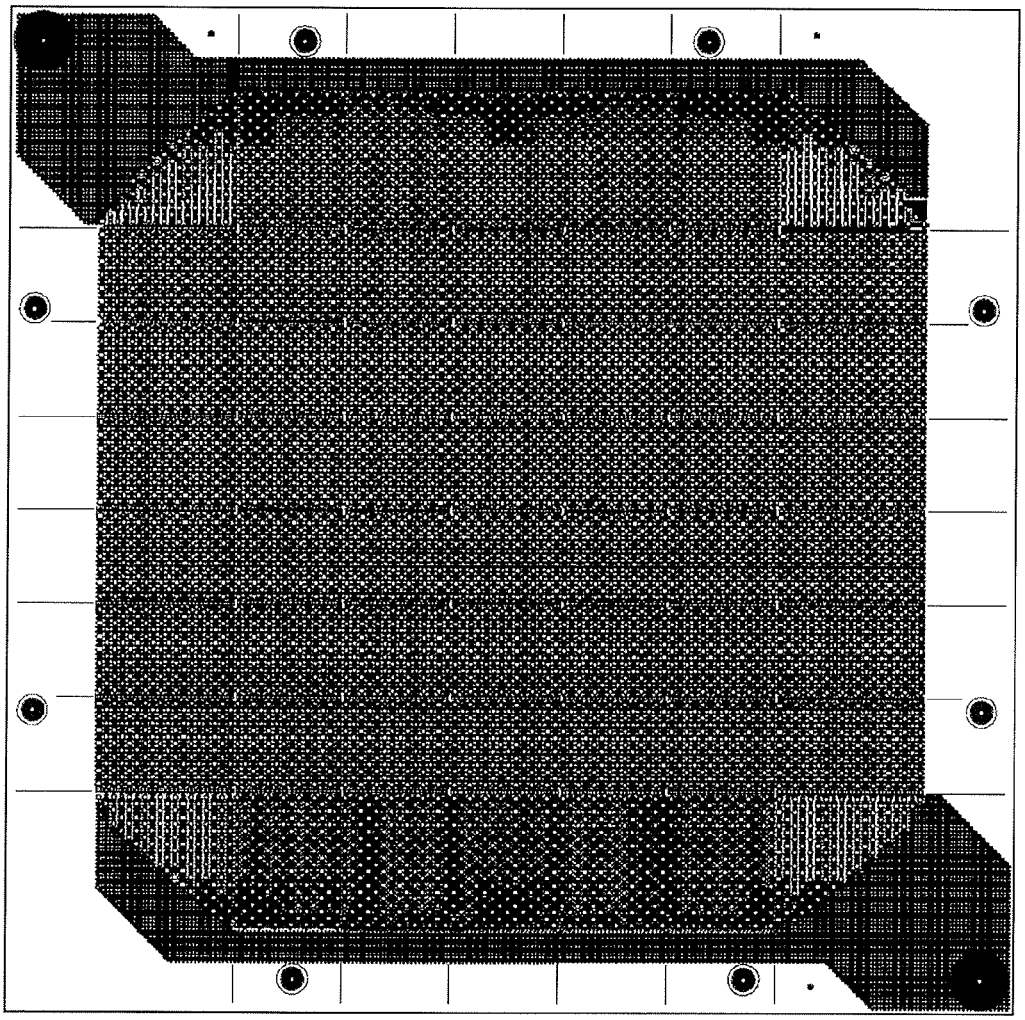
FIG. 7C shows a detailed view of a top copper layer of a printed circuit board in accordance with an embodiment of the present invention.

FIG. 7C shows the top copper layer of the printed circuit board. Unlike the back-side metallization of the A-300 for which this is designed, the top copper traces have substantially the same width and enough thickness to conduct electricity efficiently from the back traces at high concentration factors. Alternatively, the relative widths of the traces can be adjusted so that the combined conductance of the metal on the back side of the solar cell and the copper on the top side of the printed circuit board is more equally balanced. The top traces establish part of the series connections of the die and spread the heat from the cell more uniformly to the vias.

Figure 7D:
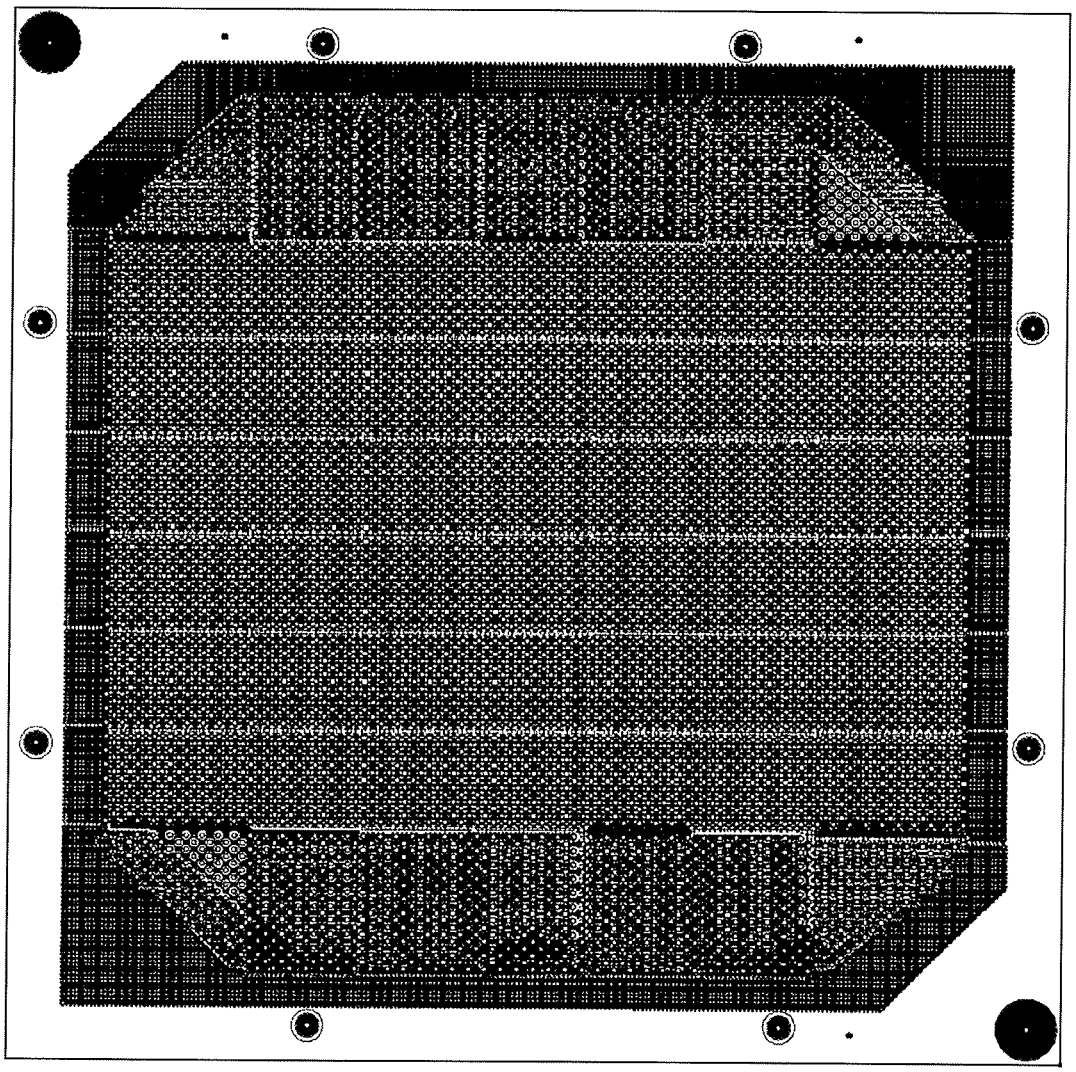
FIG. 7D shows a detailed view of a bottom copper layer of a printed circuit board in accordance with an embodiment of the present invention.

FIG. 7D shows the bottom copper layer of the printed circuit board. Again the traces are wide and cover virtually all the back side of the circuit board with breaks only to establish the proper isolation and connectivity between the die. In other embodiments, there may be no back-side copper or the back-side copper is electrically isolated from the solar cell. In some embodiments, connections can be made in internal layers of the printed circuit board as is known in the art.

Figure 8:
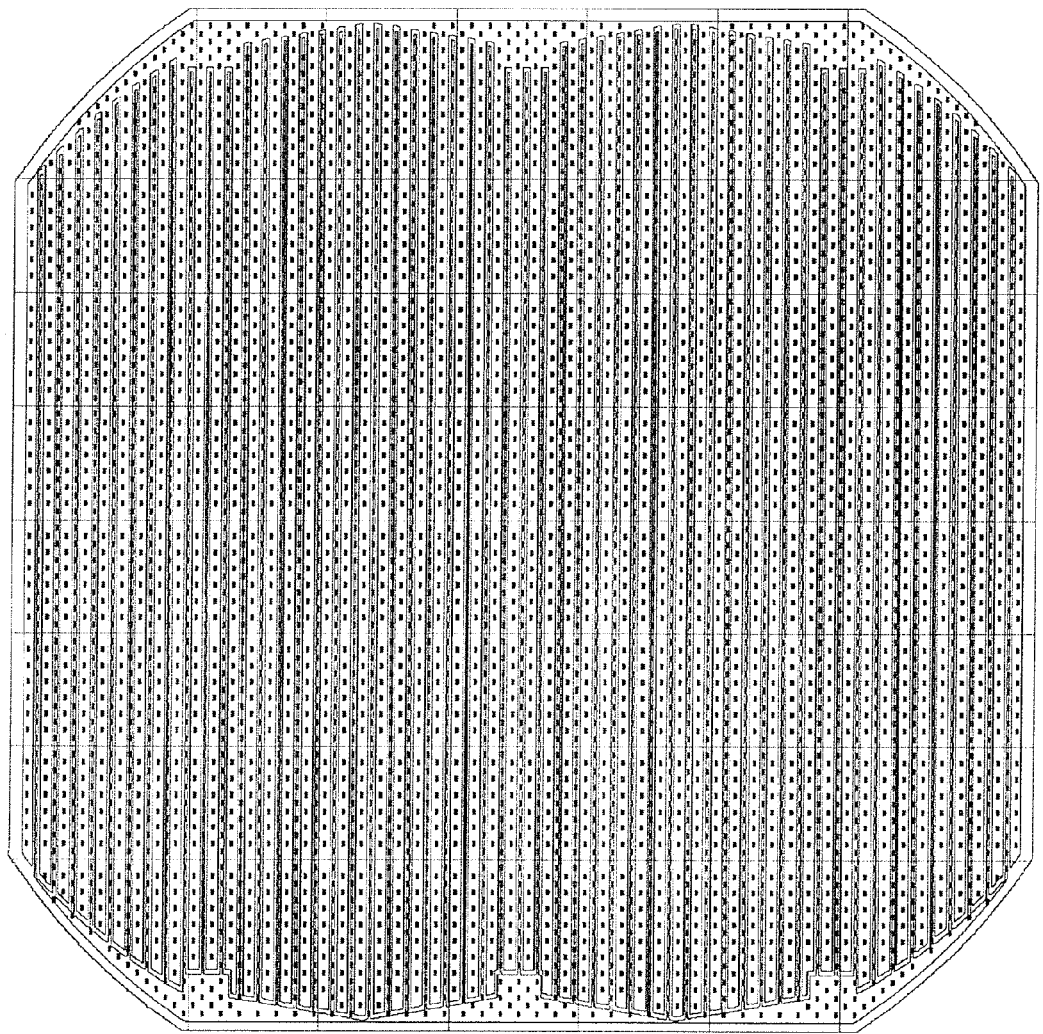
FIG. 8 shows a top view of assembled die on printed circuit board in accordance with an embodiment of the present invention.

FIG. 8 shows a top view of the assembled die on the printed circuit board shown in FIG. 7. The solder regions line up with the back metallization of the solar cell. Alignment of the die with the traces on the board is important. Without placing a solder-resist material on the back side of the solar cell, the surface tension of the solder does not provide a good self-centering force. It is best to ensure die are positioned precisely when they first contact the solder paste.

Figure 9:
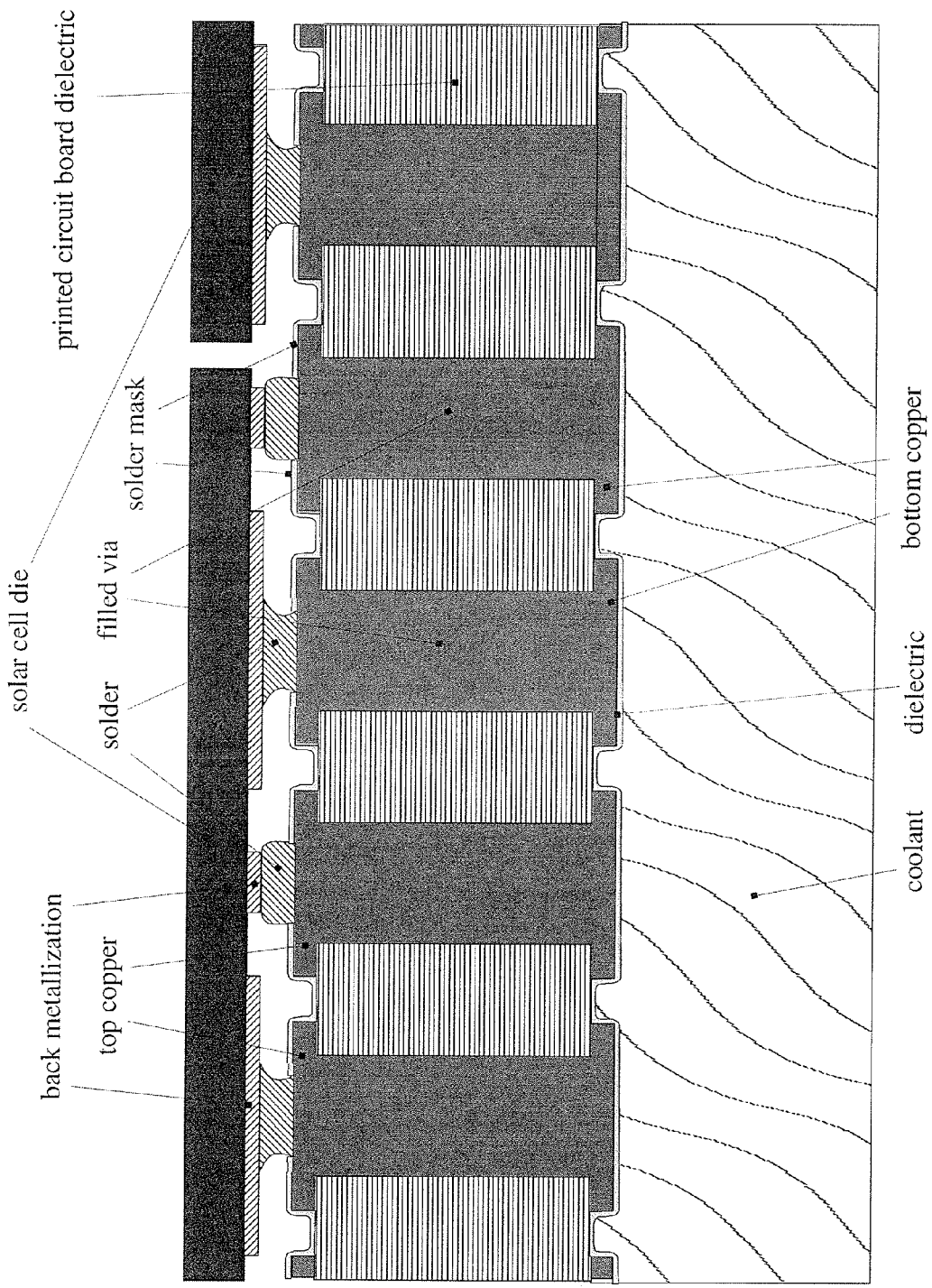
FIG. 9 shows a simplified cross-section of assembled solar cell die and printed circuit board in accordance with an embodiment of the present invention.

FIG. 9 shows an example embodiment of the cross section of the assembled board. Heat and current flows efficiently from the wafer die, through the solder through copper traces and vias. Heat flows through the vias to copper on the back side that is liquid cooled through an electrical insulator that provides good thermal conduction. Alternatively, heat transfers through a high-thermal-conductivity insulator in addition to or instead of a plurality of vias.

In some embodiments, the back side of the printed circuit board is electrically isolated from the front and is in direct contact with coolant for improved heat transfer. In some of these embodiments, the back side may be electrically tied to ground. In other embodiments, the back side may be electrically tied to a low voltage bias to inhibit corrosion or scaling.

Optically Transparent Cover

Coolant pressure from the back side may produce stresses or strains of the printed circuit board and photovoltaic assembly that are undesirable. In some embodiments of the present invention, an optically transparent element or assembly abutting or bonded to the front side of photovoltaic assembly can assist the assembly in resisting internal pressure.

This element may abut the photovoltaic material, conductors, insulators, or electrical components mounted on the front surface, or the surface of the copper or printed circuit board insulator itself. It may abut any item on the front surface either at points, over regions, or over extended surfaces and abutting surface of the transparent element may contain geometric features to perform such localization.

In some embodiments, these features may be cast, embossed, deposited, or machined into the transparent element. In other embodiments all or part of the transparent assembly is cast or cured in place. In other embodiments, a clear adhesive, e.g., epoxy, is used to bond the transparent element in place.

In some embodiments, this transparent element further provides the function of redirecting light to active regions of the photovoltaic assembly so as to increase efficiency. One such embodiment may consist of an array of lenslets (small lenses arranged into an array) that focuses incoming solar radiation directly onto active regions of the photovoltaic array while avoiding inactive sections of the array (e.g., those that may consist of conductive traces for extracting power from the array or and/or contain other electrical or electronic components such as bypass diodes). Another embodiment may redirect light unevenly to compensate for previously known variations in the conversion efficiency of elements in the photovoltaic array; an alternative embodiment may compensate for detected variations in array efficiency through active control of the transparent element's position, through the shape of one or more of its surfaces or through the movement of the receiver. This transparent element may further refractively or diffractively redistribute illumination so as to improve the uniformity of illumination or balance of illumination over different die. This transparent element may further provide spectral dispersion via the dependence of index of refraction on wavelength or via diffraction to enhance the efficiency of photovoltaic assemblies optimized to different light spectra in different spatial locations. Some regions of this element may function by reflection, e.g, from a metallized surface, index changes, multi-layer optical coatings, total internal reflection, and the like.

One embodiment of the transparent element has a circumferential variation in the curvature of its surface or surfaces (e.g., the curvature of the surface closest to the primary reflector has a cylindrical component); such a variation may be used to compensate for the astigmatic aberration induced through the use of an anisotropic film to produce an inflatable concentrator.

In some embodiments, this transparent element may contain or restrain a reflective or opaque element that protects or masks selected regions of the photovoltaic array from receiving solar radiation. Regions that may need to be protected may include those with electrical or electronic elements that cannot withstand the heating due to the incoming radiation (e.g., insulated wires, components that cannot conduct heat out quickly enough) or those that cannot operate properly or are subject to accelerated aging when exposed to intense solar radiation. The protective element/mask may be metal, metallized plastic, metallized glass, or some other suitable material; the metallization or opaque material may be directly applied to the front or back surface of the optically transparent cover.

An embodiment of this element comprises at least one holographic or diffractive optical element that provides one or more of these optical functions simultaneously. In some embodiments, this diffractive element may be stamped, embossed, etched, or deposited on a surface of the transparent element. In some embodiments, this diffractive element may arise via patterned refractive index modification, e.g., by ion or particle bombardment or implantation, chemical reactions, etc. Patterning can be performed via a variety of techniques known in the art including soft lithography, rubber stamping, conventional lithography, etc.

This transparent element may further provide protective functions against damage, e.g., during handling, distribution, or wind. It may further provide encapsulation or seal against moisture, gases, including oxygen, etc. and may provide features for aligning or mounting additional optical elements. It may provide features for convenient assembly to the receiver and for servicing or replacement. One or more of its surfaces may have an antireflection coating or single- or multiple-layer optical coatings to enhance or produce the optical function of the element.

In addition or in the alternative, one or more other optical elements that do not abut a photovoltaic assembly may be employed as described earlier. Such elements may be held rigidly or may deploy. They may be stationary or they may slew. Some embodiments may control the distance between optical elements (e.g., distance between a secondary optic and the photovoltaic array in the case where the optical element does not abut the array or distance between a secondary and a tertiary optic) as a means to adjust the distribution of the solar irradiation on the photovoltaic array (e.g., to change the effective focal length of the optical system). Flexible or articulated optical components proximate to the receiver may be controlled to adjust the irradiance distribution on the photovoltaic array. In one embodiment, secondary and/or tertiary optical elements may be controlled in an asymmetric manner in order to compensate for uneven aging of the primary reflector (e.g., age-induced astigmatism of the primary reflector, which in this embodiment may consist of an inflatable thin film. They may provide performance benefits either passively or by active control. Application of articulated elements operating analogously to image-stabilization optics may also be useful where the primary solar energy conversion is not photovoltaic.

Embodiment of a Vacuum Assisted Assembly and Alignment Jig

As used herein, a wafer is meant to include a previously diced or broken wafer as well as an intact wafer, provided its size is larger than the size of the wafer pieces that are to be used in the module, which are herein called die.

Wafers are typically diced on a single-use weakly adhesive tape. Many wafer dicing tapes employ ultraviolet or thermal release tape so that the die can be easily picked off the tape. Unfortunately, these tapes are expensive consumables and do little to facilitate subsequent mounting on a printed circuit board. Moreover, without alignment aids, the process of precisely aligning a wafer in a dicing saw can easily take many times longer than the actually dicing operation.

FIGS. 10A-B show plan and cross-sectional views, respectively, of an embodiment of a jig to facilitate rapid and precision wafer positioning on the dicing saw and die position on the printed circuit board without consumable dicing tape. Elements of a wafer dicing and printed circuit board alignment jig are shown: mechanical alignment aids, a common vacuum source or plenum, and at least one individual vacuum port for each die.

The jig optionally contains a fixed mount on the wafer saw traverse to avoid having to perform excessive saw alignment operations on each wafer. This mount holds a vacuum chuck assembly precisely in place during dicing via a repeatable precision positioner, e.g., a kinematic arrangement of balls, pins, slots, and holes along or mechanical stops and/or pins. The vacuum chuck is held in position by a retention force e.g., spring tension or compression magnetism, electrostatic force, electrostrictive force, friction, gravity, air pressure, vacuum, etc.

The vacuum chuck assembly, either alone or in combination with the wafer saw mounting bracket, provides for simple alignment of the wafer with respect to the chuck via fixed, removable, or retractable pins, mechanical stops, and/or the like. Once the wafer is placed precisely, it is held firmly by applying a partial vacuum to vacuum ports under regions between the saw cuts. Air leakage and mechanical wafer damage is mitigated by the use of a compliant vacuum gasket, made e.g., of an elastomeric material such as nitrile, buna, silicone, fluorinated elastomers, etc.

At least one vacuum port lies under each retained die. Using more than one vacuum port per die is preferred because it provides for holding the die more uniformly and firmly while preventing die warpage.

Post processing of the wafer (e.g., solder masking or solder bumping) can be performed at an appropriate time in this procedure. For example, a solder mask may preferably be applied before dicing, while solder bumping could be performed before or after.

Several multiple-die modules can be made from one wafer by placing a plurality of separate or separable vacuum chucks behind regions of the solar cell rather than one that spans the entire wafer. Similarly such a vacuum chuck or chucks can be used on sub-regions of a wafer. Alternatively, multiple printed circuit boards can be arranged in a panel using "route and retain" or "score and snap" techniques. One vacuum chuck can thus provide for accurate die placement multiple boards simultaneously. After soldering, these boards can be separated from each other.

Moreover, multiple wafers and multiple printed circuit boards can employ the same vacuum source or plenum. Such an arrangement is particularly suited to batch reflow solder operations, e.g., in a non-conveyor oven or an application-specific arrangement of electrical resistance, infrared, or hot-air heaters.

The wafer alignment features may be on the wafer-saw-mounting bracket, since this helps to reduce alignment tolerance buildup. Also, the wafer alignment features are no longer needed on the vacuum chuck once the wafer or its die are held firmly in place by the partial vacuum. The wafer can be loaded into the vacuum chuck before or after the chuck is loaded into the mounting bracket.

To prepare for soldering the diced solar cells, the printed circuit board has solder paste stencil printed or otherwise dispensed onto it as well as possibly an adhesive. To speed this process, an alignment bracket for the printed circuit board can be used.

The printed circuit board has mechanical features that index to features in the vacuum chuck, e.g., precisely located and sized holes, precision routed edges, etc.

To solder the die to the printed circuit board, the board is placed substantially straight down on the die or vice versa. The only substantial lateral movement that is tolerable when the die make contact with solder paste is along a long axis of the metallization electrodes, if any. This placement can be conducted by hand by sliding the board along alignment guides that are fixed, removable or retractable in the chuck, a hinge mechanism, or the like, or it can be automated using a robot or mechanical tool and any combination of optical fiducial marks and mechanical guides.

If the board contains a sufficiently strong adhesive or the solder paste is sufficiently sticky, it may be possible to remove the vacuum chuck after the board has been placed by gradually releasing air into the vacuum plenum. If not, the vacuum chuck may need to be operated during the reflow operation. If so, it is important to design the vacuum chuck using materials that can withstand reflow oven temperatures. For example, silicone and some fluorinated elastomers are good candidates for the vacuum gasket. In conveyor-chain reflow ovens and others, it is not convenient to maintain vacuum during the reflow procedure. A vacuum quick disconnect with an integrated or external valve is useful, but again, must be able to withstand reflow-oven temperatures.

Care should be taken to avoid warpage of the printed circuit board during the soldering procedure. Rigid mechanical stops and clamps may be employed for this purpose. It is possible to solder additional electronic components on either the solar cell side of the printed circuit board before during or after the solar cell die are soldered, provided the vacuum chuck, clamps, etc. are designed correctly.

One issue associated with soldering everything at the same time, is the odd heat profile that will generally be required if the vacuum chuck is used in the reflow oven. The desire to avoid this complication may merit the extra cost and assembly steps associated with adhesively bonding the die to the circuit board before reflow.

Several techniques can be used to avoid the build up of warpage and mechanical stress from thermal expansion mismatches. Examples of such techniques include the use of indium or other comparatively low temperature and mechanically compliant solders, the use of reduced-thermal-expansion materials such as alumina, aluminum nitride or beryllium oxide printed circuit board insulators, keeping die size small to limit accumulated strain buildup, and prestressing or mechanically constraining the printed circuit board during soldering.

Of these techniques, the latter two are most preferred, since the specialty solders typically cost an order of magnitude or more higher than conventional solders. Low thermal expansion materials are also more expensive than commoditized printed circuit board materials. However, they may confer other advantages, e.g., good intrinsic heat transfer, that offset their higher price. The higher price of the materials may also be offset by elimination of the cost associated with the introduction of thermal vias in the circuit board substrate. The costs of reduced die size are extra saw cuts and relatively more damaged die surface.

Mechanical constraints can be imposed through the use of a reusable jig or application specific reflow heater. This jig can also use a vacuum chuck. One arrangement of such a jig with the die vacuum chuck is a precision indexed clam-shell or sandwich in with the printed circuit board and wafer die precisely positioned in three dimensions in the center of the jig.

Embodiment of Electrical Insulation of the Module

The cooled back side of the board has live electrical connections at up to tens of volts with respect to each other and up to hundreds or thousands of volts with respect to earth ground. If the coolant is conductive, e.g., ground or tap water, a thin dielectric layer that is relatively impermeable and inert to the coolant and coolant impurities or additives can be employed to insulate the back copper electrically from the coolant, as shown in FIG. 9. This dielectric must not excessively resist heat transfer from the copper to the coolant. Fortunately, relatively thin films of dielectrics, e.g., <1 to 100 µm, can resist voltages encountered in typical solar modules. The dielectric layer could alternatively be a dielectric heat-transfer liquid or thin layer of heat-transfer grease, gel, epoxy or solid that is isolated from the primary coolant by a low-thermal-resistance divider plate.

The cost and complexity of this secondary cooling liquid could be justified if the primary coolant is exceptionally corrosive, e.g., saltwater, and the temperatures are relatively high, e.g., boiling or if the possibility of metals such as lead, indium, germanium, and the like leaching into the water supply is unacceptable, e.g., if the hot water is to be used for household purposes or irrigation. A divider plate or other printed circuit board reinforcement may also be necessary if high coolant pressure or pressure spikes must be endured.

As disclosed previously, an embodiment of this electrical insulation is a sufficiently thermally conductive printed circuit board insulator. Since suitable materials are generally brittle, it is possible for cracks and pinholes to appear in this dielectric over its lifetime. These cracks may not directly compromise the electrical insulation but when wetted with coolant, may provide ionic channels that can leak current and lead to shortened lifetime or possibly electrical safety hazards.

To prevent coolant from reaching the dielectric, a ductile or compliant surface having a low thermal resistance may be applied to the printed circuit board dielectric. A preferred material is a copper layer, since copper has outstanding thermal performance and lifetime in may coolants of interest, e.g., water, optionally with additives such as pH controls, buffers, corrosion inhibitors and the like. In some embodiments, the copper may be plated, e.g., with gold or other metals for additional protection.

Embodiment of the Cooling System

From a system design perspective, placing a high concentration of solar radiation on the photovoltaic cells is desirable because it reduces the amount of expensive photovoltaic material in the system, and, up to a point, can increase the conversion efficiency of the cells. However, that portion of the incident sunlight not converted to electricity by the photovoltaic cells is absorbed and converted to heat. Since the electric conversion efficiency of common photovoltaic cells decreases with increasing temperature, it is desirable that the system include a heat exchanger that can remove the heat from the cells to keep their temperature as low as possible. In fact, at very high solar concentrations, system survival requires efficient heat removal. One key to efficient heat removal is to keep the distance over which the heat must flow as small as possible. This leads to heat exchangers with small physical dimensions.

The back side of the printed circuit board or optional divider plate may feature pins, channels or other geometrical features well known in the art to enhance heat transfer, but such features add considerable cost to the module. One embodiment in accordance with the present invention uses a substantially flat plate or a substantially flat, insulated back side of the printed circuit board. Natural convection of heat from the flat plate can be enhanced by any combination of eddying, forced convection, nucleate boiling, and film boiling.

In order to reduce the overall receiver module cost as well as the cost of the pumping system and its operation, it may be desirable to cool the solar module at the lowest possible flow rate and pressure drop. Normally, highly turbulent flow is used to draw hot liquid from the wall chaotically through the bulk of the liquid. Most liquid heat exchangers for solar cooling employ cooling tubes, which require a high Reynolds number to benefit from eddy-based transport of hot liquid from the wall. If the channel is reduced in size to increase the Reynolds number to improve eddy transport, the pressure drop increases. If the channel diameter is increased at constant Reynolds number, the required flow rate increases.

One alternative arrangement in accordance with an embodiment of the present invention uses a an immersed jet or "shower head", also herein referred to as a "perforated plate", splitter, or divider, to produce inertial transport of cool liquid to the surface and in so doing, drive eddy-based transport of hot liquid from the wall at a much lower Reynolds number and flow rate than is otherwise needed. Cool liquid is fed by a pressure difference to an inlet plenum that is separated from an outlet plenum by a divider, herein called a "shower head", containing one or preferably a plurality of holes. The diameter and number of holes is adjusted with the coolant flow rate to ensure that the water flows from the inlet plenum through the holes in the outlet plenum via an inertial jet. This cooling method is also commonly referred to as "jet impingement" cooling.

In such jet impingement cooling, the surface to be cooled is situated between about ⅛th to 8 times the orifice spacing or 2 to 100 times the orifice diameter away from the shower head. The shower head and surface to be cooled could be substantially parallel or tilted at an angle to bias the flow in the direction of an exit orifice. The shower head can also be convex or otherwise warped so that the emerging jets bias the flow of the hot water as needed. There is no need to seal the outer edges of the shower head provided the leakage from the inlet to the outlet plenum along these regions is comparably small.

While several possibilities exist for removing the heat from the power module while keeping the cell temperatures low, the use of a jet impingement heat exchanger has the advantages of simplicity, low pressure drop, and low cost over most other methods. Heat transfers best in regions of high shear, and jet impingement allows for short flow paths that are conducive to high heat transfer coefficients.

A jet impingement heat exchanger utilizes a liquid or gaseous jet or array of such jets impinging on a surface to transfer heat between the fluid and the surface. In accordance with one embodiment, the fluid is a liquid coolant (e.g., water) removing heat from the back of a photovoltaic power module. The jets may be formed using holes (nozzles) in a perforated plate, with flow entering a plenum behind the perforated plate, flowing through the nozzles, and impinging on the surface to be cooled. The jets may be submerged (i.e., they emerge from the nozzles into a surrounding region of the same liquid), so that the array performs identically regardless of its orientation with respect to gravity.

After flowing through the perforated plate and impinging on the cooled surface, the bulk flow exits the exchanger through a slot to one side of the jet array. In one embodiment of the receiver, the coolant exit is below the inlet, thus requiring plumbing on only one side of the heat exchanger.

Keeping the return flow below the incoming flow also allows the pipe used for the return flow to act as a shield, protecting the pipe carrying the incoming coolant from any solar radiation that spills past the edge of the receiver module. Additional shielding can be placed on standoffs to provide additional protection from stray solar radiation.

For maximum thermal transfer between the coolant and the cooled surface, the distance between the end of the jet nozzle and the cooled surface should be roughly equal to the length of the potential core of the jet. For a given jet geometry and flow rate, it has been shown that the ideal distance between the jet and the cooled surface is in the range of 5.5 jet diameters. See Martin, H., "Heat and mass transfer between impinging gas jets and solid surfaces", Advances in heat transfer, vol. 13, pp 1-60 (1977). It may be noted that gas and liquid jet impingement performance predictions are similar when scaled properly for Reynolds Number and Prandtl Number.

An embodiment of a receiver heat exchanger comprises a shower head made from a sheet metal plate that is stamped with a plurality of holes and spot welded, folded, or soldered, or similarly manufactured to a leak-proof sheet metal box, can, or other envelope that provides for mounting of the printed circuit board and solar module and inlet and outlet coolant conduits. Another preferred embodiment of the shower head is a similar physical arrangement of shower head and box or cylinder that is injection molded or cast in a high-temperature-tolerant plastic, such as PET, PEEK, PPS, PVF, PTFE, acetal, or silicone with appropriate fillers or metal, such as zinc and its alloys.

In other embodiments, materials having a lower operating temperature could be used, especially if coolant temperatures are maintained appropriately low and the plastic material is itself shielded or shadowed from concentrated solar radiation. Suitable materials include nylon, polypropylene, ABS, PVC, vinyl, HDPE, LDPE, acrylic, polycarbonate, and many other materials known in the art of injection molding. These materials may be chosen for low cost, dimensional stability, strength, long-term compatibility with coolants, resistance to solar radiation and ultraviolet light, if unshaded. Alternatively, these materials could be coated, laminated, or otherwise shaded from direct, reflected, or concentrated solar light.

Outflow from a jet impingement array can affect the uniformity of heat transfer, since jets near the exit of the array experience higher cross-flows than those away from the exit region, where the bulk flow velocity is lower. High outflow velocity can cause system inefficiency due to the higher pressure drop needed to drive the flow.

The pressure difference required to drive the outflow results in a pressure variation across the jet array. If the pressure drop across the jet nozzles is not much larger than the pressure variation across the array, the coolant flow distribution across the array may be non-uniform, potentially impacting the performance of the heat exchanger. Also, even though a higher cross-flow can lead to a higher heat transfer coefficient, the resulting nonuniformity in heat transfer coefficient can lead to inefficiencies, since the current through a simple series connection of photovoltaic cells is limited to that produced by the weakest cell.

Figure 12A:
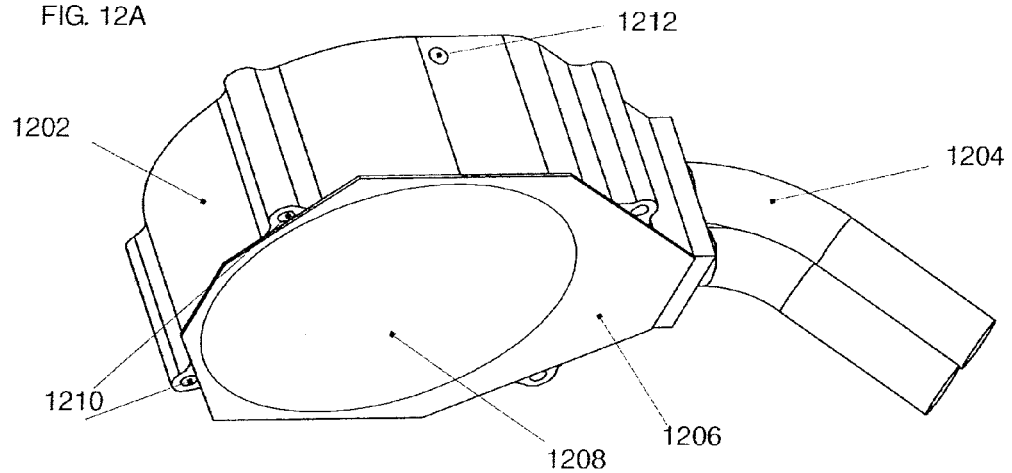
FIG. 12A shows an assembly view of an alternative shower-head heat exchanger design in accordance with an embodiment of the present invention.

FIG. 12A shows an assembly drawing of an embodiment of a jet impingement cooler as mounted to an embodiment of a strut 1204. Element 1202 is the body of the cooler assembly, injection molded from plastic, cast from metal or plastic, or machined or formed by some other means from metal or plastic.

Element 1206 is the exterior of the flat plate upon which the cooling jets impinge internally; as shown it is made from a ceramic substrate with the edges scribed and snapped to final form. In alternate embodiments, element 1206 may be shaped by other means (e.g., cut with a laser) and/or may be a different material (e.g., a fiberglass and epoxy circuit board).

The active region of the receiver is depicted by element 1208. It is here where energy from a solar concentrator would fall upon a photovoltaic array and excess heat would be removed by the jet impingement cooler. Not depicted is an optically transparent cover that could also be an element of this embodiment; such a cover could be used to press the plate 1206 to the body 1202 through the attachment holes 1210 or by other means (e.g., clamps). Element 1212 is an optional attachment point for the receiver module cables (the same as element 312 from FIG. 3).

Figure 12B:
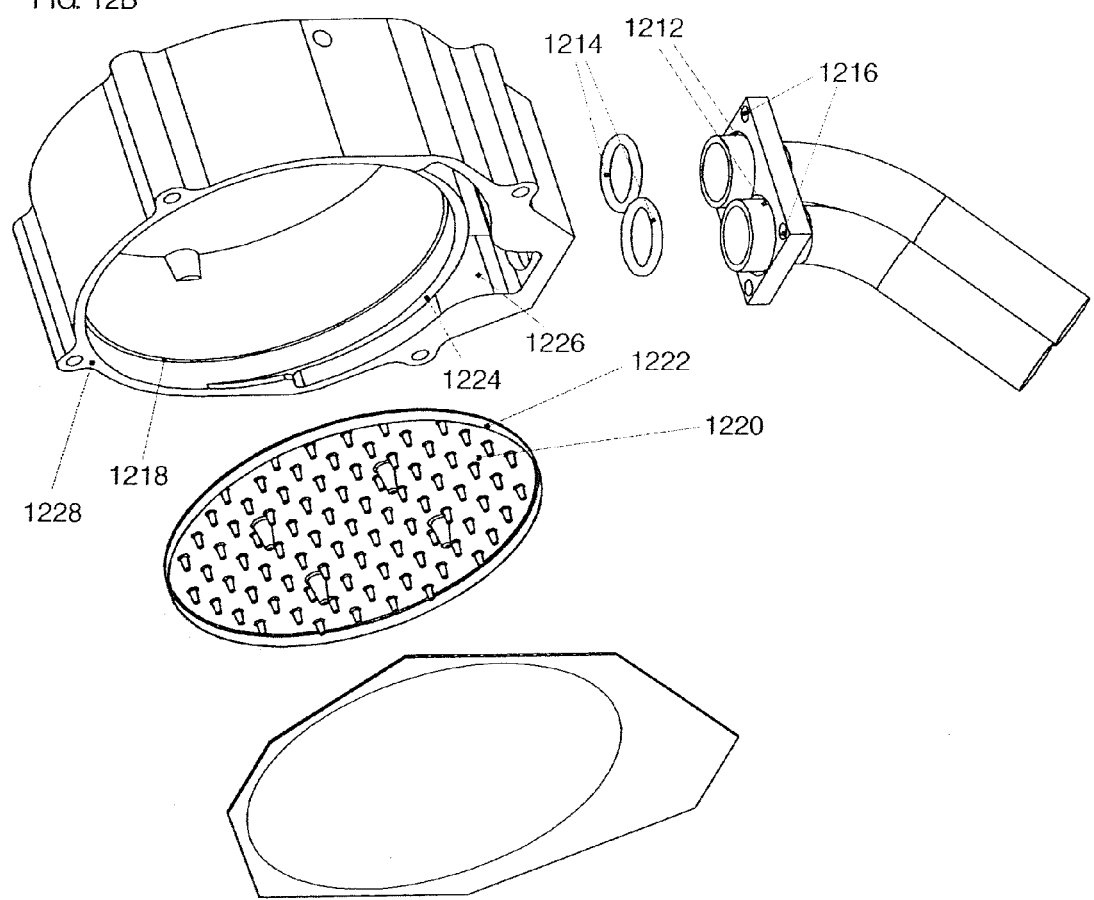
FIG. 12B shows an exploded view of components that comprise an alternative shower-head heat exchanger design in accordance with an embodiment of the present invention.

FIG. 12B shows an exploded diagram of the embodiment from FIG. 12A. The strut 1204 has been removed to expose the o-rings 1214 and o-ring grooves 1212 that seal the strut-heat exchanger interface. The holes 1216 in the receiver strut are used to attach the strut to the body of the heat exchanger. The plate 1206 from FIG. 12A has been removed to expose the perforated plate 1220, which would normally be pressed into the body of the heat exchanger and rest against the ledge 1218.

The flange feature 1222 provides stiffness to the perforated plate and provision for the interference fit between it and the heat exchanger body without risking buckling of the perforated plate itself. The fit between the flange 1222 and the heat exchanger body also seals the edge of the perforated plate, ensuring that most of the flow goes through the holes in the plate. Other embodiments of the heat exchanger may have an integrally cast perforated plate or one that is welded or adhesively bonded in place.

Figure 11:
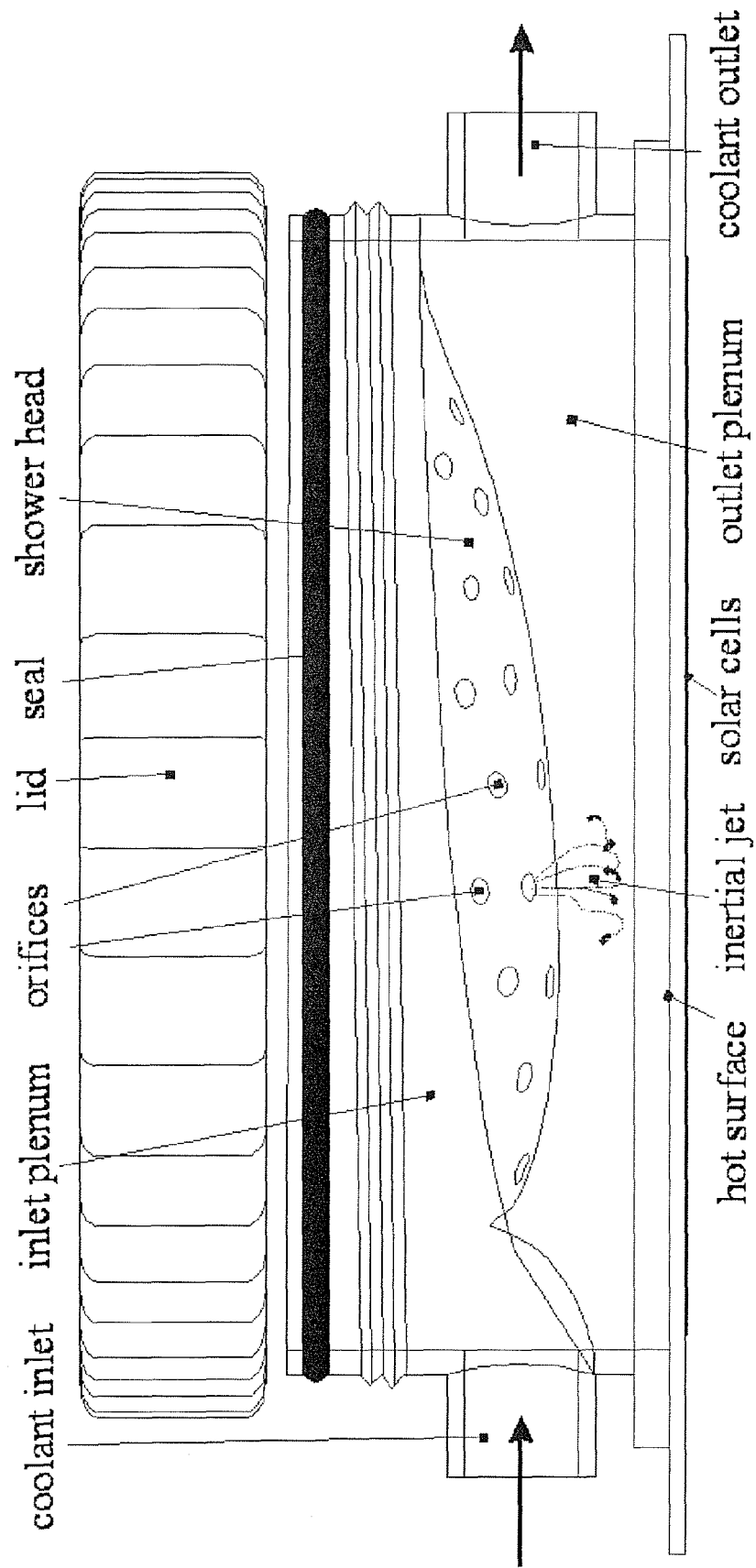
FIG. 11 shows elements of a shower head heat exchanger in accordance with an embodiment of the present invention.

An advantage of the use of a compression seal is the ability to remove the perforated plate, e.g., to replace or service the plate. An advantage of producing the plate separately from the housing body is the ability to optimize the plate and housing material selection independently and the possibility of servicing or replacing the plate. Alternatively, servicing of the plate could be performed through an access door or lid in the housing as shown in FIG. 11.

Element 1224 depicts the ledge past which the coolant flows as it leaves the jet array and enters the exit plenum 1226. Element 1228 is the sealing surface between the cooled plate 1206 (from FIG. 12A) and the body of the heat exchanger; the seal may be achieved through the use of a gasket, o-ring, chemical adhesive (e.g., RTV silicone sealant) or other means. The plate could alternatively be held in slots or features molded or machined into the housing or by a variety of other techniques known in the art.

Figure 13A:
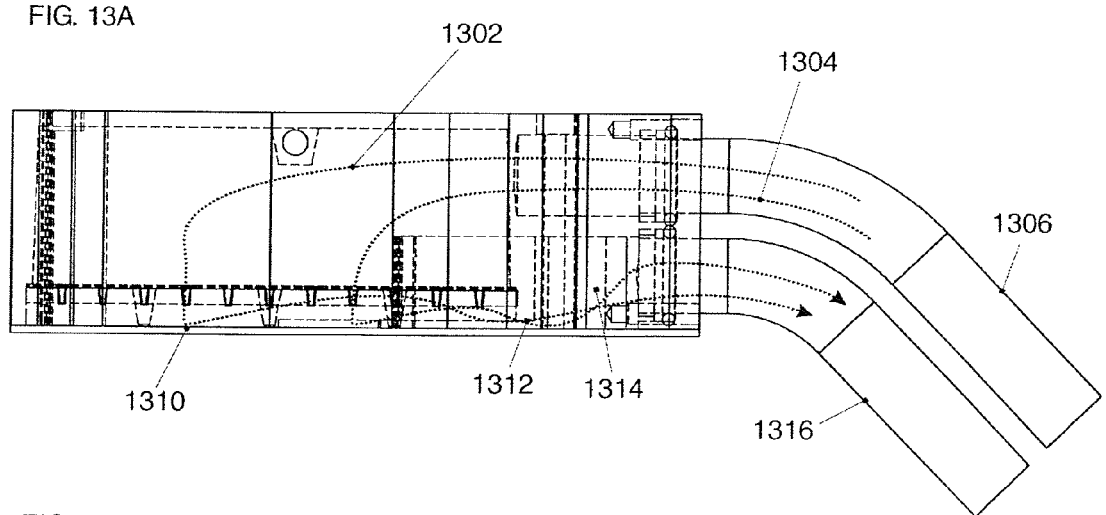
FIG. 13A shows a side view of the main housing of an alternative shower-head heat exchanger design with the water flow-path indicated.
Figure 13B:
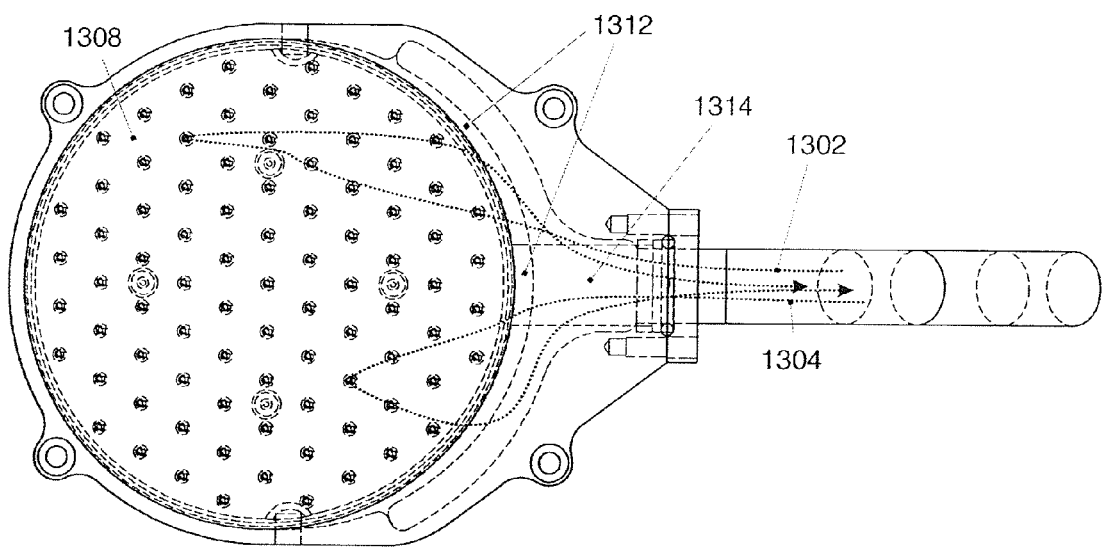
FIG. 13B shows a bottom view of the main housing of an alternative show-head heat exchanger design with the water flow-path indicated.

FIG. 13A shows a side view of one embodiment of a jet impingement cooler, while FIG. 13B shows a bottom view of the same embodiment. In both figures, two lines, denoted 1302 and 1304, trace notional paths of the flow through the heat exchanger. The paths shown were chosen to illustrate operation of the device and are not intended to indicate exact flow patterns (i.e., the inlet flow may be turbulent so that different fluid particles traveling through the same point in the inlet tube may end up traveling through different holes in the perforated plate).

The flow starts on the top right of FIG. 13A in the inlet tube, 1306, of the strut; the flow then proceeds into the plenum above the perforated plate 1308. The flow then passes through the holes in the perforated plate, impinges on the cooled surface 1310, and then flows to the right, where it leaves the array, going under the lip 1312 and into the exit plenum 1314. From there, the flow exits the system through the strut exit tube 1316.

In some embodiments of the jet impingement cooler, the jet nozzles extend out from the perforated plate surface, permitting an optimal distance between the nozzle exit and the cooled surface while still maintaining a large spacing between the surface of the perforated plate and the cooled surface. Possible advantages of this design include:

1) An increase in the structural rigidity of the perforated plate since it is no longer a simple plane (important in maintaining the distance between the perforated-plate and the cooled-plate under the pressure drop across the perforated plate).

2) For a perforated plate made of metal, the stamping of out-of-plane structures provides an opportunity to work harden the material, further increasing the stiffness of the part.

3) Lower velocity of the outflow of coolant from the jet array due to the larger outflow area. Advantageous due to reduced pressure differential needed to drive the outflow, resulting in more uniform jet velocities/mass flowrates across the array. Lower outflow velocity also lowers the variation in heat transfer across the jet array 4) The extension of the nozzle past the surface of the perforated plate improves the entrainment of the surrounding coolant into the jet, improving the efficiency of the heat removal process (more heat is removed per unit of fluid pumped through the heat exchanger).

5) In the case where the perforated plate is not molded as an integral part of the heat exchanger housing, the increased spacing between perforated plate and the cooled surface allows room to have a shelf supporting the edge of the perforated plate above the array exit while still allowing sufficient height for the slot through which the coolant exits the region of the jet impingement array and enters the exit plenum.

Small posts can be used to help support the center of the perforated plate. The posts must be small to prevent a hot spot from appearing under them on the cooled surface; how small depends on the thermal conductivity of the material from which the cooled plate is made.

1) The posts can be created at the same time as the extended jet nozzles described above, either through injection molding of plastic, stamping of metal, or some other manufacturing process.

2) The maximum displacement of a fixed plate under pressure scales with the size of the unsupported span to the fourth power and inversely with the thickness of the plate to the third power. Thus, for a fixed maximum allowed displacement under the pressure required to flow coolant through the nozzles, it is possible to reduce the thickness of the perforated plate by a factor of 2 for every reduction in spanned distance by a factor of 2. One post in the center would allow the thickness of the plate to be reduced by a factor of two, all other things being equal. Additional posts would ideally be placed such that the maximum unsupported span is a minimum for the number of posts, allowing for the need to place posts as far as possible from jet nozzles to avoid interference with heat transfer.

Figure 14A:
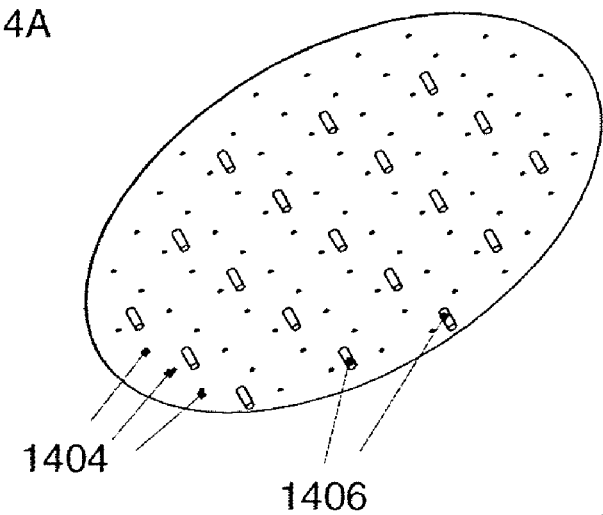
FIGS. 14A-C shows views of one embodiment of a stand-off splitter or perforated plate used to produce inertial jets of coolant.
Figure 14B:
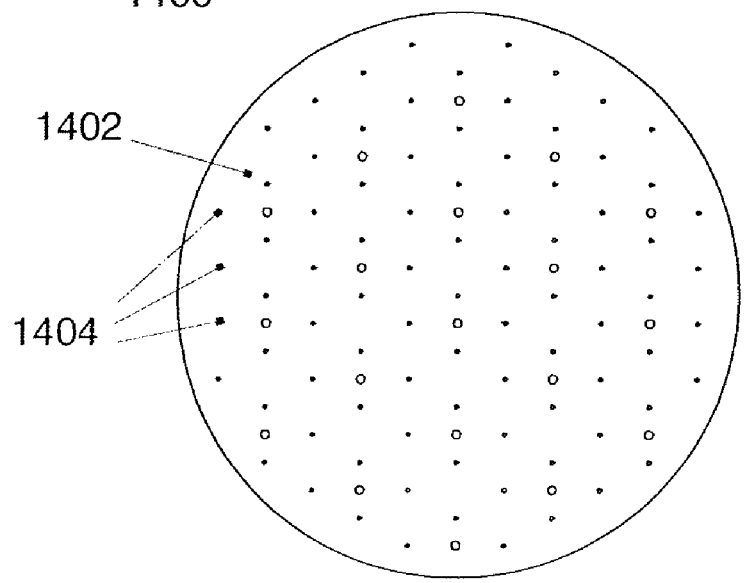
Figure 14C:
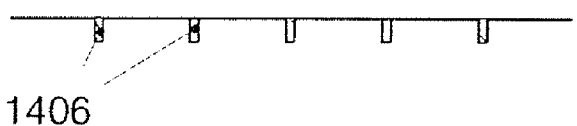
Figure 15A:
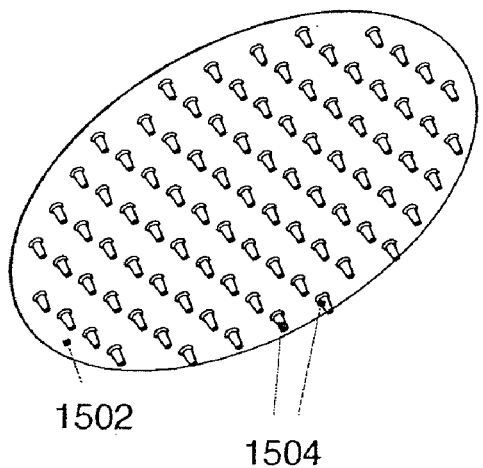
FIGS. 15A-D show views of an alternate embodiment of the splitter perforated plate in which extended nozzles are formed or cast to enhance jet impingement while providing a relatively unobstructed path for the exhaust flow.
Figure 15B:
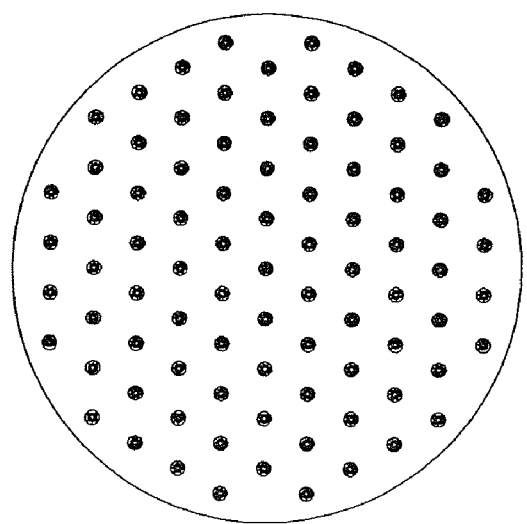
Figure 15C:
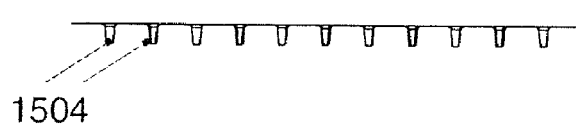
Figure 15D:
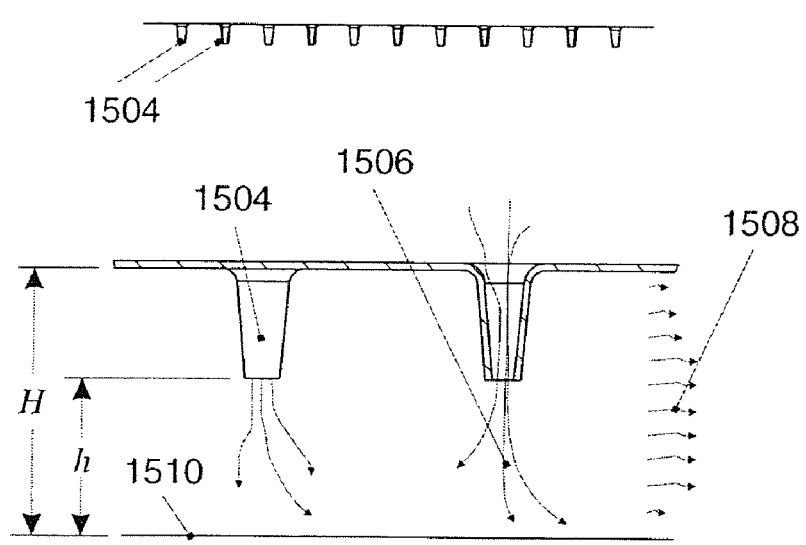

FIG. 14 shows an embodiment where the perforated plate 1402 contains nozzles (in this case, holes) 1404 as well as standoff's 1406 that help support the plate against the pressure across it. In an alternate embodiment, the standoffs could be attached or integral to the cooled plate rather than the perforated plate.

The standoffs could be made of a thermally conductive material and they could be bonded to the cooled plate with a low thermal resistance joint or be an integral part of the cooled plate. In either of these cases, they could provide enhanced heat transfer as well as support of the perforated plate. The role of standoffs could be alternatively performed by a suitably bent wire, mesh, stamped sheet, etc., particularly one having good thermal conductivity and inertness, e.g., copper and its alloys.

An embodiment of the perforated plate with extended nozzles is shown in FIG. 15. Element 1502 is the perforated plate body, while the elements 1504 are the nozzles that extend from the plate. The bottom of the figure is a blow-up of a side view that shows how the extended nozzles allow for a small distance "h" between the nozzle exit and the cooled surface 1510 while maintaining a larger distance "H" between the perforated plate and the cooled surface. The result is that the fluid in the jets 1506 exiting the nozzles 1504 has the full height "H" to flow out of the array, as depicted by the path lines 1508.

Figure 16:
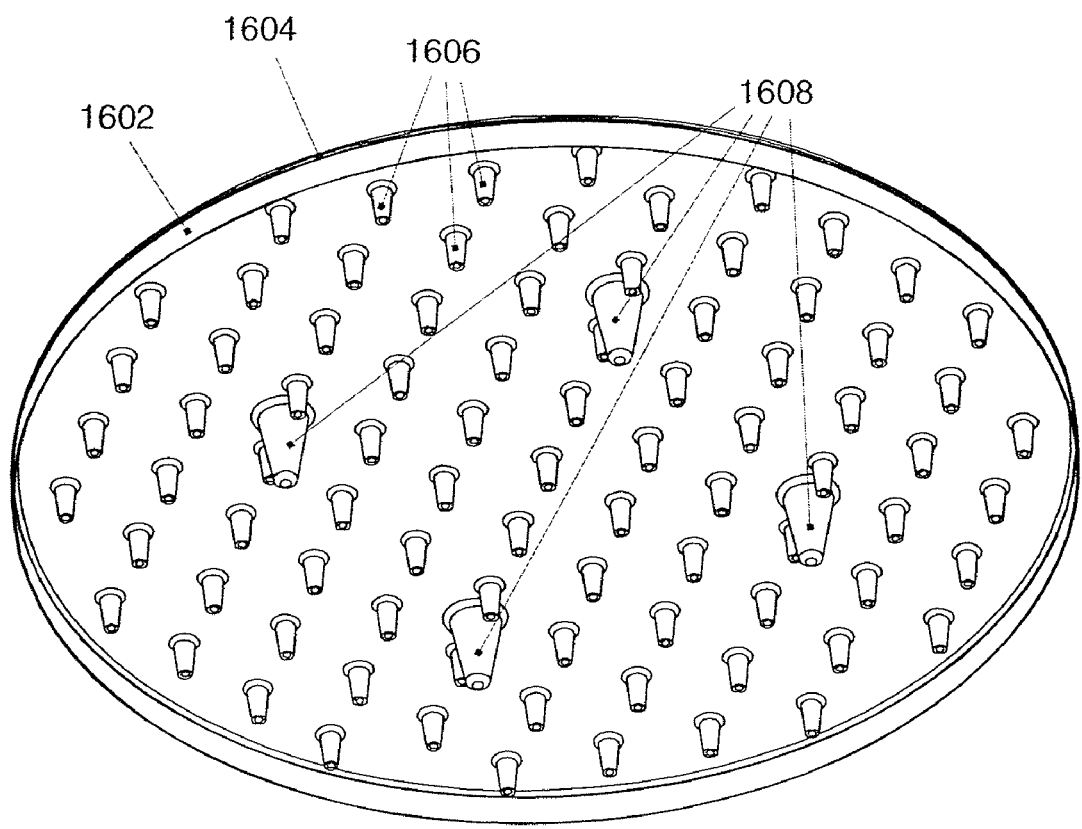
FIG. 16 shows a view of an alternate embodiment of the perforated plate in which standoffs and extended nozzles are both present.

FIG. 16 shows an embodiment where both standoffs and the extended nozzles are present. Element 1602 is the sealing surface that presses against the inside of the heat exchanger body, and element 1604 is a reinforcement that seats against the ledge inside the body of the heat exchanger, fixing the location of the perforated plate. Elements 1606 are the extended nozzles and elements 1608 are the standoffs.

Figure 17A:
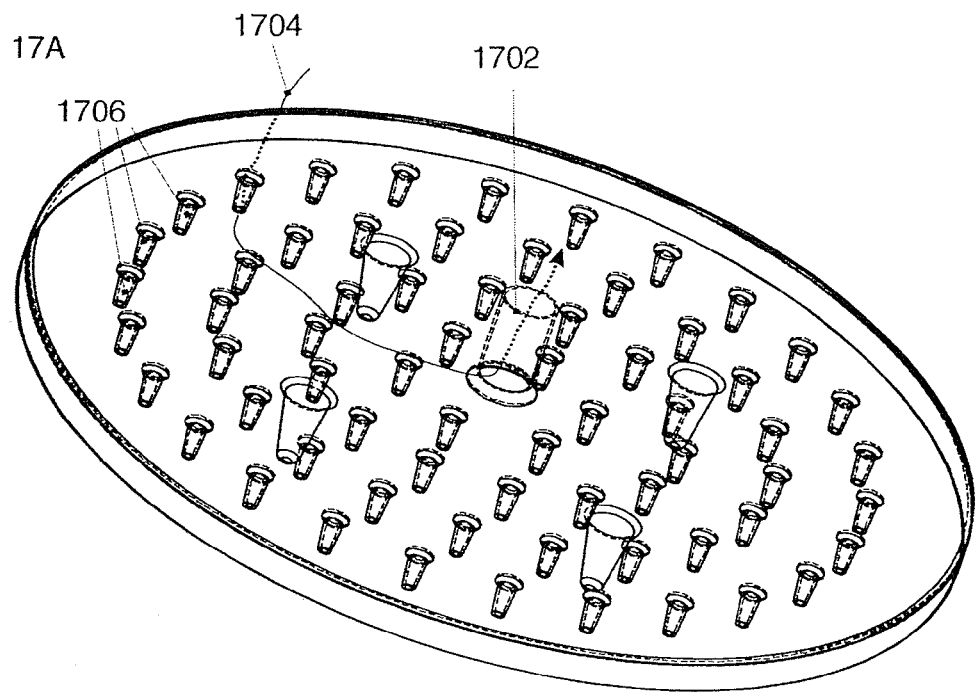
FIG. 17A shows an alternate embodiment of the showerhead heat exchanger where the flow exits the jet array from the center rather than an edge.

FIG. 17A shows an alternate embodiment of the perforated plate for the jet impingement heat exchanger where the flow returns through a tube (element 1702) in the center of the plate. The flow is depicted by a notional pathline 1704 that shows a fluid particle traveling through one of the extended nozzles 1706, impinging on the cooled surface (not seen) and then exiting the jet array through the tube 1702.

In this embodiment air would be bled from the system by starting it with the exit tube pointed to the side (or better yet, as far downward as possible). Once the air has all passed through the perforated plate to its downstream side, the heat exchanger would be re-oriented with the exit tube pointing straight up, at which point remaining air on the low pressure side of the perforated plate would exit through the tube 1720.

This embodiment offers the advantage that, as long as there is a check valve to prevent reverse flow through the heat exchanger inlet, and the exit tube is between horizontal and upright (allowing horizon-to-horizon tracking of the sun), a leak in the coolant loop outside of the heat exchanger cannot drain all of the coolant from the heat exchanger body. At least all coolant below the level of the exit tube will be retained inside the heat exchanger. This remaining coolant provides a fail-safe that can give a solar concentrator system time to shutdown before permanent damage occurs due to a loss of coolant accident.

Figure 17B:
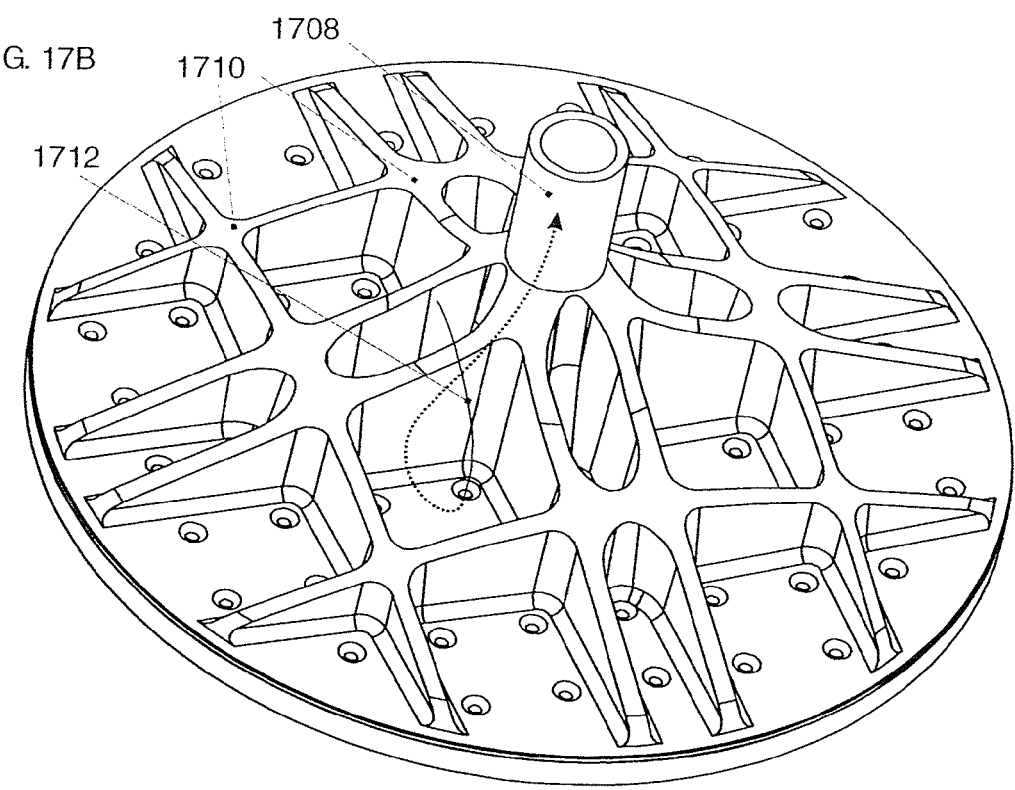
FIG. 17B shows an alternate embodiment of the showerhead heat exchanger where the flow exits the jet array from distributed channels before collecting in a central tube.

FIG. 17B shows an embodiment of the perforated plate similar to that in FIG. 17A, but where the flow returns through channels 1710 distributed across the surface of the perforated plate. The channels all meet in the center of the perforated plate at the exit tube 1708, and they should be made large enough to prevent surface tension from blocking any of them when there is air in the system. A notional pathline, 1712, for a fluid particle shows its trajectory through one of the nozzle holes, impinging on the cooled surface (not shown) and then traveling up through the return channel, eventually reaching the exit tube 1708.

The method for bleeding air from this embodiment is the same as that which would be used for the embodiment of FIG. 17A, but the presence of the channels aids in the rapid removal of any air bubbles from the system. Behavior in a loss of coolant accident would be essentially the same as for the embodiment of FIG. 17A.

The channels in this embodiment provide additional stiffening of the perforated plate. However, the pockets the channels form around the nozzles require that the flow in the exchanger to turn sharply before going through the nozzles. These sharp turns may produce a non-uniform distribution of flow through the nozzles. This phenomenon may be mitigated by designing the hole diameter and flow rate such that pressure drop across the perforated plate is significantly larger than the dynamic pressure of the flow entering the plenum above the perforated plate.

The pattern of nozzles in the perforated plate of FIG. 17B is rectangular, whereas the hole pattern in other embodiments shown has been triangular. The pattern of nozzles in the perforated plate can be varied as needed to accommodate requirements such as packaging. Also, the density of the nozzles in the perforated plate may also be adjusted to tailor the pattern of heat transfer from the cooled plate. In addition or alternatively, the distributions of hole sizes nozzle-to-plate distances, etc. may be varied to effect a desired heat-flux profile.

Embodiments of the jet impingement cooler described herein may have the following characteristics. The expected cooled area may be 10-15 cm diameter. The expected nozzle diameters may be in the range of 0.5 to 2.0 mm The expected nozzle exit to cooled surface spacing may be 4-12 nozzle diameters. The expected inter-nozzle spacing may be 5 mm to 20 mm. The expected flowrates may be in the range of 1 to 8 liters per minute of coolant for removing 1-3 kW of heat. The expected heat transfer coefficients for the cooler may be in the range of 0.25 to 4 $W/(K\ cm^2)$.

Because the orifices in the shower head may clog or silt or salt deposits may build up, particularly on the surface to be cooled, it is preferred to facilitate cleaning and servicing of the receiver assembly in the field, e.g., by the incorporation of an assess door or hole or by providing for partial disassembly and reassembly in the field. Such provisions are complicated by the need to operate over high temperatures and wide temperature ranges, including sub-freezing without any liquid or vapor leaks.

One receiver arrangement providing such service access, is an o-ring or gasket sealed assembly of two parts. If parts are injection molded from plastic, at least the regions near the o-ring or gasket seals may be reinforced with a material that has low thermal creep, such as metal, fiberglass, Kevlar or carbon fibers etc. Either face seals or circumferential seals can be used. For o-rings, circumferential seals appear to have cost and convenience advantages.

For example, one embodiment of the receiver assembly includes two short cylindrical sections as shown in FIG. 11. The printed circuit board, electrical, electronic, and receiver module mounting and fluid connections are on one cylinder. The other cylinder has an end cap and possibly knurling features as well as an injection molded thread or bayonet-style release that coordinates with complementary features on the other cylinder. In one embodiment, one of the two cylinders has an o-ring retained in an o-ring slot (preferably under weak tension along the outside of the cylinder).

Servicing and inspecting the heat exchanger then requires only a partial turn or few turns of the cylindrical "lid," followed possibly by the removal of an injection molded or sheet metal shower head. O-ring seals are reliable and relatively tolerant of dimensional errors and creep, although their reliability may be compromised by excessive swelling or thermal creep of the receiver assembly housing. O-rings tend to cost more than other sealing options, like gaskets.

One alternative embodiment uses a gasketed face seal like that of a jar lid instead of an o-ring. The jar-lid approach can possibly benefit from the commoditization of well-engineered metallic and plastic lids for wide-temperature service. However, the designer or operator must ensure there is adequate preload on the gasket to prevent leakage after the gasket has crept and viscoelastically relaxed.

A method for starting the cooling system relies upon the embodiment where the coolant inlet and outlet pipes are on the same side of the heat exchanger. he system would normally run closed-loop, but if air gets into the coolant lines (e.g., during construction or during servicing), bleeding the system will be needed to ensure that all heat exchangers are operating at maximum efficiency.

One way of performing such a bleeding procedure is to tip the system so that the inlet is down, so remaining air on the upstream side of the perforated plate moves to the far end of the jet array, away from the inlet, and is forced through the perforated plate to the downstream side of the exchanger. Next, the system is tipped so that the outlet is up and the remaining air on the downstream side of the perforated plate is driven toward the outlet and leaves the exchanger.

An embodiment of a system of multiple heat exchangers comprises connecting the heat exchangers in parallel. This arrangement results in a higher mass flowrate through the system, but the pressure drop through the cooling system will be lower compared to a series arrangement. Parallel flow also results in lower peak temperatures, since coolant only flows through one heat exchanger before being returned to a secondary heat exchanger or a holding tank. In the case of the holding tank, the coolant can be flowed through the system at night to reject the heat stored during the daytime; heat exchange could also occur between the atmosphere and the pipes supplying the coolant to the concentrator assemblies. Connecting the heat exchangers in parallel also ensures that any air in an heat exchanger does not pass through all of the downstream heat exchangers before exiting the system. A small settling tank with a bleed valve can be included in the system to prevent air from reaching the pump and being returned to the cooling system.

Receiver Strut

Figure 18A:
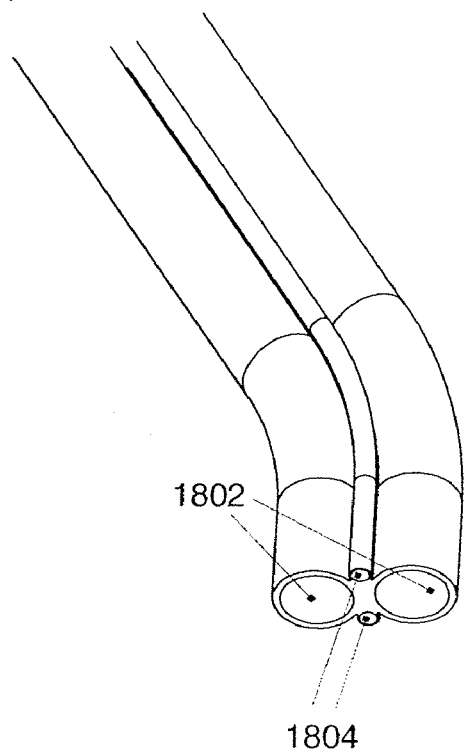
FIG. 18A shows a rigid strut having provision for additional electrical cables.
Figure 18B:
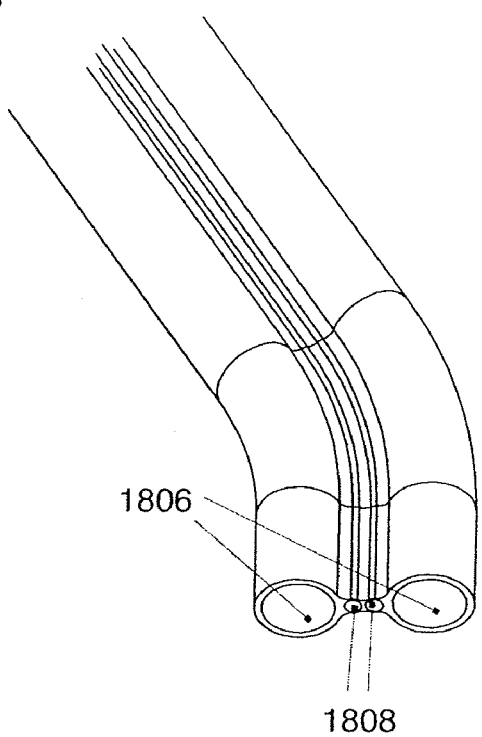
FIG. 18B shows a rigid strut having an alternate provision for electrical cables that supports fabrication via injection molding.

FIGS. 18A and 18B show possible embodiments of the receiver strut assembly. Both embodiments feature integration of the cable-carrying function of the strut with the pipes carrying coolant flow to and from the receiver head.

In FIG. 18A the coolant pipes 1802 are joined with the cable runs 1804 on either side of them. This design is compatible with construction through an extrusion process using plastic or an extrudable metallic alloy.

In FIG. 18B the cable carrying portion of the structure, 1808, links the inlet and outlet pipes 1806. This design is compatible with injection molding of the parts as clamshells that can be mated to form a finished assembly.

FIG. 19 shows a more detailed embodiment of a strut assembly with additional features needed by a functional solar collecting system. The coolant inlet and outlet pipes 1902 and 1904 are joined with cables 1906, 1908, 1910 and 1912, which reflect the need to carry positive and negative power lines, a signal line, and a ground line to the receiver head. The coolant pipes may be made from a plastic, composite or metallic material.

The ground line is needed in the event that the coolant pipes of the strut are made of an electrically non-conductive material. The ground line must be kept separate from the positive and negative power lines because the photovoltaic array may operate at an electrical potential far from the ground potential; in the event of a coolant leak or other failure, the ground line will prevent the entire system from reaching a dangerously high potential.

Element 1914 of FIG. 19 depicts the joint between the strut and the receiver head assembly. The joint provides mechanical and fluid connections to the head. Element 1916 shows the routing of electrical cabling to the electronic section of the receiver head, while element 1918 shows a possible attachment point for the tension cables that hold the receiver head in place.

In some embodiments of the present invention, the saw kerf or cut width of the cell is not sufficiently wide that the die can be used in a circuit as cut or is too wide. In some cases, the die can be used after an adjustment of their spacing in one or more directions. Such spacing adjustment can be done with a simple modification of the vacuum chuck used to hold die.

Figure 20:
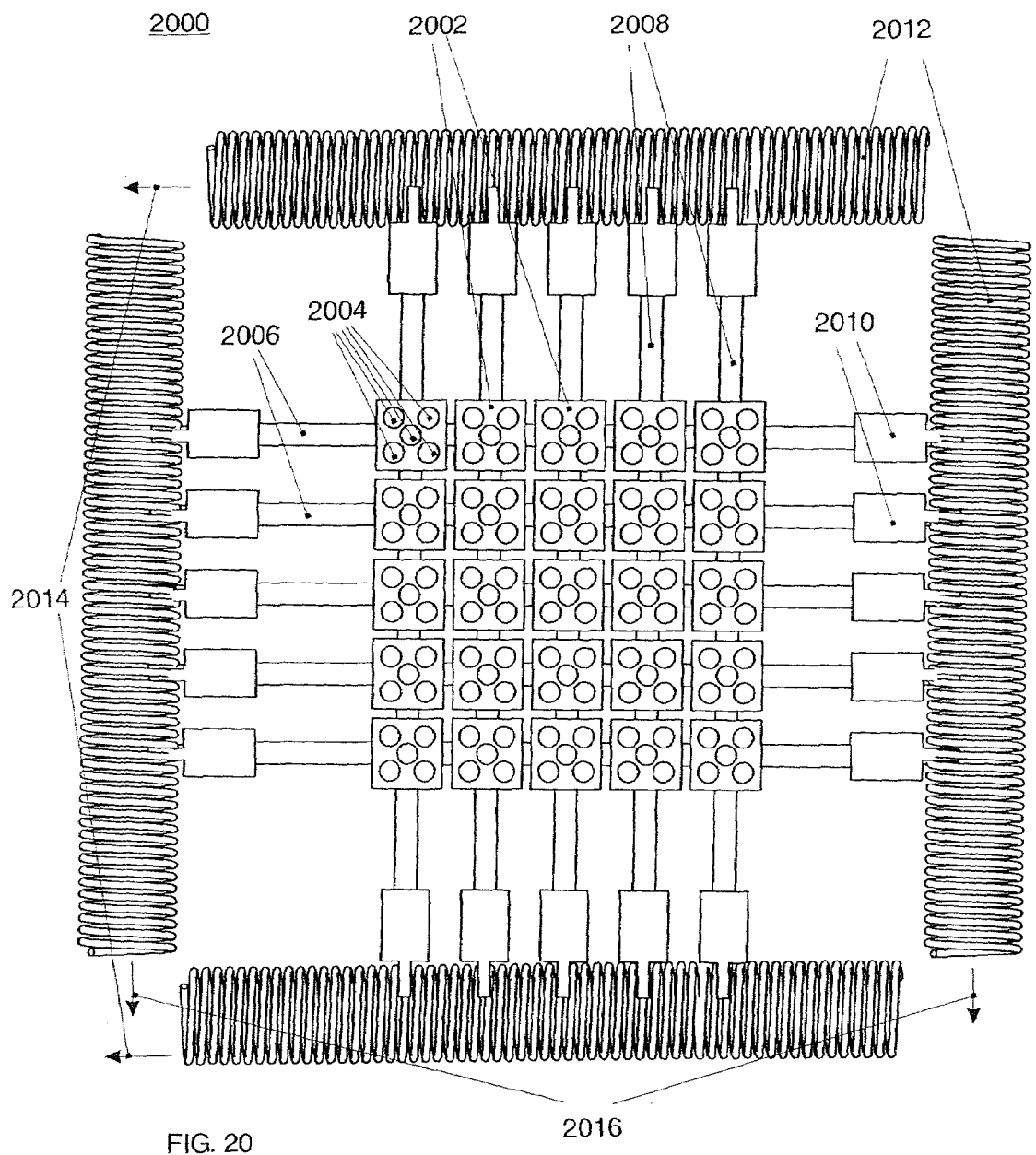
FIG. 20 shows an example of a vacuum mount for holding and uniformly spreading solar cell die prior to bonding.

FIG. 20 shows a diagram of an alternate embodiment of a fixture to hold a wafer during dicing and to position the die precisely onto a printed circuit board. Elements 2002 are individual chucks for die. In this embodiment, the chucks are vacuum operated and elements 2004 are vacuum ports. Alternatively, die could be held electrostatically, adhesively, etc., as described earlier. Shafts 2006 and 2008 pass through crossing holes in the chucks such that the distance between chucks can be adjusted in one direction by moving the shafts 2006 toward or away from each other and in another direction by moving shafts 2008 toward or away from each other. In the embodiment shown, the spacing of the shafts is controlled through a linkage 2010 by pairs of stiff springs 2012. A motion 2014 of one end of one set of springs proportionally adjusts the spacing in one direction. A motion 2016 of the one end of another proportionally adjusts the spacing in the other direction. Alternatively, a series of individual springs could be used in place of the single springs. In either event, springs may be employed having a restoring force that greatly exceeds friction forces between the shafts and holes in the chucks. Alternatively, this adjustment could be made by the use of multiple-pitch threaded rods, cams, and a wide range of techniques that will be obvious to one skilled in the art. Alternatively, the springs and rods may be replaced by mounting or integrating individual chucks on an elastic film assembly or membrane that can be stretched radially or in two directions. The film assembly itself may provide vacuum or adhesive connections to die.

Having thus described exemplary embodiments of the present invention, it should be noted by those skilled in the art that the within disclosures are exemplary only and that various other alternatives, adaptations, and modifications may be made within the scope of the present invention. Accordingly, the present invention is not limited to the specific embodiments as illustrated herein, but is only limited by the following claims.

What is claimed is:

1. A method of assembling a photovoltaic receiver, the method comprising:
   holding a solar cell against a common support in an aligned position;
   dicing the solar cell, while being held to the common support, into individual pieces having a diode, wherein a substantial number of the individual pieces are held to the common support after dicing;
   forming a PC board having a plurality of electrically conducting vias therethrough; and
   disposing backsides of the individual pieces onto the PC board aligned to the underlying vias, while being held to the same common support used for dicing.

2. A method of assembling a photovoltaic receiver, the method comprising:
   disposing a front side of a substrate having a plurality of photovoltaic regions on a common support;
   holding the substrate against the common support in an aligned position;
   physically separating the plurality of photovoltaic regions into individual dies, while being held to the common support, wherein a substantial number of the individual dies are held to the common support after the photovoltaic regions are separated into the individual dies; and
   contacting back sides of the separated individual dies with patterned conductors bonded to an insulating substrate, while being held to the same common support used for physically separating the plurality of photovoltaic regions.

3. The method of claim 2 wherein holding the separated individual dies in contact with the common support is done by a vacuum force.

4. The method of claim 1 further comprising aligning the solar cell to the common support.

5. The method of claim 1 further comprising removing the PC board with aligned individual pieces disposed on the PC board from the common support.

6. The method of claim 1 wherein holding the substrate and individual pieces against the common support is done by a vacuum force.

7. The method of claim 2 further comprising aligning the substrate to the common support.

8. The method of claim 2 further comprising removing the patterned conductors, which have aligned individual dies disposed thereon, from the common support.

* * * * *